(12) United States Patent
Youn et al.

(10) Patent No.: US 12,225,772 B2
(45) Date of Patent: Feb. 11, 2025

(54) ORGANIC LIGHT EMITTING DISPLAY PANEL AND ORGANIC LIGHT EMITTING DISPLAY DEVICE INCLUDING THE SAME

(71) Applicant: LG Display Co., Ltd., Seoul (KR)

(72) Inventors: Jae-Woong Youn, Gyeonggi-do (KR); InJune Kim, Seoul (KR); Younsub Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 580 days.

(21) Appl. No.: 17/520,471

(22) Filed: Nov. 5, 2021

(65) Prior Publication Data
US 2022/0149134 A1    May 12, 2022

(30) Foreign Application Priority Data
Nov. 6, 2020    (KR) ........................ 10-2020-0147375

(51) Int. Cl.
*H10K 59/121*    (2023.01)
*H10K 59/122*    (2023.01)
*H10K 59/123*    (2023.01)
*H10K 59/131*    (2023.01)

(52) U.S. Cl.
CPC ....... *H10K 59/1216* (2023.02); *H10K 59/122* (2023.02); *H10K 59/123* (2023.02); *H10K 59/131* (2023.02)

(58) Field of Classification Search
CPC ............. H10K 59/1216; H10K 59/122; H10K 59/123; H10K 59/131; H10K 59/124; H10K 59/126; H10K 59/173; H10K 50/10; H10K 50/88; H01L 27/1255; H01L 23/52; H01L 23/5223
See application file for complete search history.

(56) References Cited

U.S. PATENT DOCUMENTS

| | | | |
|---|---|---|---|
| 2014/0175393 A1* | 6/2014 | Beak | H10K 59/1216 257/40 |
| 2015/0155348 A1* | 6/2015 | Yamazaki | H01L 27/1255 257/72 |
| 2018/0174952 A1* | 6/2018 | Kim | H01L 23/49811 |
| 2020/0111413 A1* | 4/2020 | Park | G09G 3/3233 |
| 2022/0037447 A1* | 2/2022 | Cho | H10K 59/131 |

* cited by examiner

*Primary Examiner* — Mohammad A Rahman
*Assistant Examiner* — Sandra Milena Rodriguez Villan
(74) *Attorney, Agent, or Firm* — Seed IP Law Group LLP

(57) ABSTRACT

A light emitting display panel and a device light emitting display device including the same including a substrate, a thin film transistor disposed on the substrate layer and comprising a first active layer a first gate electrode and the first electrode pattern, a first insulating layer disposed on the thin film transistor, a conductive pattern disposed on the first insulation layer, a second insulating layer disposed on the conductive pattern, a first electrode disposed on the second insulating film, and contacted to the first electrode pattern, and a bank exposing a portion of the top surface of the first electrode, wherein the first electrode and the conducting pattern is used as an electrode of storage capacitor and the conducting pattern is overlapped with a top surface of the first electrode not overlapped with the bank.

19 Claims, 26 Drawing Sheets

ORGANIC LIGHT EMITTING DISPLAY PANEL AND ORGANIC LIGHT EMITTING DISPLAY DEVICE INCLUDING THE SAME

CROSS-REFERENCE TO RELATED APPLICATION

This application claims priority from Korean Patent Application No. 10-2020-0147375, filed on Nov. 6, 2020, which is hereby incorporated by reference for all purposes as if fully set forth herein.

BACKGROUND

Technical Field

The present disclosure relates to a light emitting display panel and a device light emitting display device including the same.

Description of the Related Art

A display device that implements various information on a screen is a key technology in the information and communication era, which is developing in the direction of thinner, lighter, portable and high-performance. Accordingly, as a flat panel display capable of reducing weight and volume, which are disadvantages of a cathode ray tube (CRT), an organic light emitting display device that displays an image by controlling the amount of light emitted by an organic light emitting layer is in the spotlight. The organic light emitting display device is a self-light emitting device using a thin light emitting layer between electrodes, and has an advantage in that it can be thinned.

In such an organic light emitting display device, a plurality of pixels including a plurality of sub-pixels provided in an organic light emitting display panel are arranged to display an image.

BRIEF SUMMARY

In order to realize the high resolution of the organic light emitting display device, the number of pixel areas per unit area must be increased, which means that the size of one sub-pixel area is reduced. The inventors of the present disclosure have appreciated that as the size of one sub-pixel area is reduced, the area of the storage capacitor decreases, thereby decreasing the capacity of the storage capacitor. Although the capacity of the storage capacitor may be increased by increasing the area of the electrode of the storage capacitor, the area of the actual sub-pixel becomes smaller as the area of the storage electrode increases, thereby making it difficult to design the sub-pixel.

Accordingly, the inventors have recognized that there is a benefit to provide the organic light emitting display capable of providing a high-capacity storage capacitor within a limited area of the sub-pixel.

One or more embodiments of the present disclosure provides a light emitting display panel and a device light emitting display device including the same that include a storage capacitor having a high capacity without difficulty in designing sub-pixels even in a high resolution display device.

One or more embodiments of the present disclosure also provides a light emitting display panel and a device light emitting display device including the same that may reduce a defect rate due to a difficulty in a process by implementing a storage capacitor with the high capacity without the difficulty in designing the sub-pixels.

According to an aspect of the present disclosure, there is provided a light emitting display device including a substrate, a thin film transistor disposed on the substrate layer and including a first active layer a first gate electrode and the first electrode pattern, a first insulating layer disposed on the thin film transistor, a conductive pattern disposed on the first insulation layer, a second insulating layer disposed on the conductive pattern, a first electrode disposed on the second insulating film, and contacted to the first electrode pattern, and a bank exposing a portion of the top surface of the first electrode. The first electrode and the conducting pattern is used as an electrode of storage capacitor and the conducting pattern is overlapped with a top surface of the first electrode not overlapped with the bank.

According to another aspect of the present disclosure, there is provided an organic light emitting display panel comprising at lease a thin film transistor and a storage capacitor in an active area. The organic light emitting display panel includes a substrate, a thin film transistor disposed on the substrate layer and including a first active layer a first gate electrode and the first electrode pattern, a first insulating layer disposed on the thin film transistor, a conductive pattern disposed on the first insulation layer, a second insulating layer disposed on the conductive pattern, a first electrode disposed on the second insulating film, and contacted to the first electrode pattern, and a bank exposing a portion of the top surface of the first electrode. The first electrode and the conducting pattern is used as an electrode of storage capacitor and the conducting pattern is overlapped with a top surface of the first electrode not overlapped with the bank According to aspects of the present disclosure, a storage capacitor may have a high capacity without difficulty in designing sub-pixels even in a high resolution display device.

In addition, according to aspects of the present disclosure, it is possible to reduce a defect rate due to a difficulty in a process by implementing a storage capacitor with the high capacity without the difficulty in designing the sub-pixels.

BRIEF DESCRIPTION OF THE SEVERAL VIEWS OF THE DRAWINGS

The accompanying drawings, which are included to provide a further understanding of the present disclosure and are incorporated in and constitute a part of this application, illustrate aspect(s) of the present disclosure and along with the description serve to explain the principle of the present disclosure.

FIGS. 5A, 5B to 15A, 15B illustrate a subpixel of the light emitting display device according to aspects of the present disclosure.

DETAILED DESCRIPTION

Figure 1:
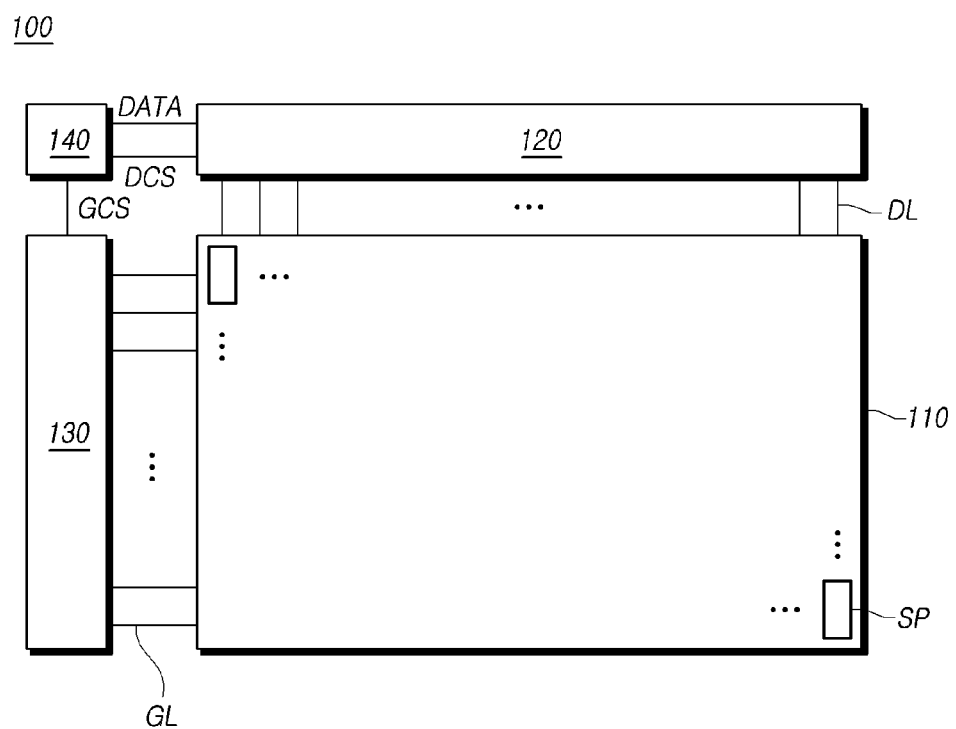
FIG. 1 is a system diagram of a light emitting display device according to the present disclosure.

In the following description of examples or aspects of the present disclosure, reference will be made to the accompanying drawings in which it is shown by way of illustration specific examples or aspects that can be implemented, and in which the same reference numerals and signs can be used to designate the same or like components even when they are shown in different accompanying drawings from one another. Further, in the following description of examples or aspects of the present disclosure, detailed descriptions of well-known functions and components incorporated herein will be omitted when it is determined that the description may make the subject matter in some aspects of the present disclosure rather unclear. The terms such as "including," "having," "containing," "constituting," "make up of," and "formed of used herein are generally intended to allow other components to be added unless the terms are used with the term "only." As used herein, singular forms are intended to include plural forms unless the context clearly indicates otherwise.

Terms, such as "first," "second," "A," "B," "(A)," or "(B)" may be used herein to describe elements of the present disclosure. Each of these terms is not used to define essence, order, sequence, or number of elements, etc., but is used merely to distinguish the corresponding element from other elements.

When it is mentioned that a first element "is connected or coupled to," "contacts or overlaps," etc., a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc., each other via a fourth element. Here, the second element may be included in at least one of two or more elements that "are connected or coupled to," "contact or overlap," etc., each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes, etc., are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can."

FIG. 1 is a system diagram of a light emitting display device 100 according to aspects of the present disclosure.

Referring to FIG. 1, the light emitting display device 100 according to the present aspects may include a display panel 110 in which a plurality of data lines DL and a plurality of gate lines GL are disposed and a plurality of subpixels SP connected to the plurality of data lines DL and the plurality of gate lines GL are disposed and may include driving circuits which drive the display panel 110.

In terms of a function, the driving circuits may include a data driving circuit 120 for driving the plurality of data lines DL, a gate driving circuit 130 for driving the plurality of gate lines GL, and a controller 140 for controlling the data driving circuit 120 and the gate driving circuit 130.

In the display panel 110, the plurality of data lines DL and the plurality of gate lines GL may be disposed to overlap each other. For example, the plurality of data lines DL may be disposed in rows or columns, and the plurality of gate lines GL may be disposed in column or rows. Hereinafter, for convenience of description, it is assumed that the plurality of data lines DL are disposed in rows and the plurality of gate lines GL are disposed in columns.

The controller 140 supplies various control signals DCS and GCS for driving operations of the data driving circuit 120 and the gate driving circuit 130 to control the data driving circuit 120 and the gate driving circuit 130.

The controller 140 starts scanning according to a timing implemented in each frame, converts input image data input from an external source into a data signal format used in the data driving circuit 120 to output converted image data DATA, and controls data driving at a proper time in accordance with the scanning.

The controller 140 receives various timing signals including a vertical synchronization signal Vsync, a horizontal synchronization signal Hsync, an input data enable (DE) signal, and a clock signal CLK, as well as the input image data, from the external source (for example, a host system).

The controller 140 not only converts the input image data input from the external source into the data signal format used in the data driving circuit 120 and outputs the converted image data DATA, but also receives the various timing signals including the vertical synchronization signal Vsync, the horizontal synchronization signal Hsync, the input DE signal, and the clock signal and generates and outputs various control signals to the data driving circuit 120 and the gate driving circuit 130 in order to control the data driving circuit 120 and the gate driving circuit 130.

For example, the controller 140 outputs various gate control signals GCS including a gate start pulse (GSP), a gate shift clock (GSC) signal, a gate output enable (GOE) signal, and the like in order to control the gate driving circuit 130. Here, the GSP controls an operation start timing of one or more gate-driver integrated circuits (G-DICs) constituting the gate driving circuits 130. The GSC signal is a clock signal commonly input to one or more G-DICs and controls a shift timing of a scan signal (gate pulse). The GOE signal designates timing information of one or more G-DICs.

In addition, the controller 140 outputs various data control signals DCS including a source start pulse (SSP), a source sampling clock (SSC) signal, a source output enable (SOE) signal, and the like in order to control the data driving circuit 120. Here, the SSP controls a data sampling start timing of one or more source driver integrated circuits constituting the data driving circuit 120. The SSC signal is a clock signal for controlling a data sampling timing of each of the source driver integrated circuits. The SOE signal controls an output timing of the data driving circuit 120.

The controller 140 may be a timing controller that is used in common display technology or may be a control device that includes a timing controller to further perform other control functions.

The controller 140 may be implemented as a component that is separate from the data driving circuit 120 and may be integrated with the data driving circuit 120 to be implemented as one integrated circuit.

The data driving circuit 120 receives the image data DATA from the controller 140 and supplies data voltages to the plurality of data lines DL to drive the plurality of data lines DL. Here, the data driving circuit 120 is also referred to as a source driving circuit.

The data driving circuit 120 may be implemented to include one or more source-driver integrated circuits (S-DICs). Each S-DIC may include a shift register, a latch circuit, a digital-to-analog converter (DAC), an output buffer, and the like. Each S-DIC may further include an analog-to-digital converter (ADC) in some cases.

Each S-DIC may be connected to a bonding pad of the display panel 110 through a tape-automated bonding (TAB) method or a chip-on glass (COG) method, may be disposed directly in the display panel 110, or may be disposed to be integrated into the display panel 110 in some cases. In addition, each S-DIC may be implemented through a chip-on film (COF) method so as to be mounted on a source-circuit film connected to the display panel 110.

The gate driving circuit 130 sequentially supplies scan signals to the plurality of gate lines GL to sequentially drive the plurality of gate lines GL. Here, the gate driving circuit 130 is also referred to as a scan driving circuit.

The gate driving circuit 130 may include a shift register, a level shifter, and the like.

The gate driving circuit 130 may be connected to the bonding pad of the display panel 110 through a TAB method or a COG method, may be implemented as a gate-in panel (GIP) type to be disposed directly in the display panel 110, or may be disposed to be integrated into the display panel 110 in some cases. In addition, the gate driving circuit 130 may be implemented using a plurality of G-DICs and may be implemented through a COF method so as to be mounted on a gate-circuit film connected to the display panel 110.

The gate driving circuit 130 sequentially supplies scan signals having an on-voltage or off-voltage to the plurality of gate lines GL under control of the controller 140.

When a specific gate line is enabled by the gate driving circuit 130, the data driving circuit 120 converts the image data DATA received from the controller 140 into data voltages having an analog form and supplies the data voltages to the plurality of data lines DL.

The data driving circuit 120 may be positioned only at one side (for example, an upper side or a lower side) of the display panel 110. In some cases, the data driving circuit 120 may be positioned at both sides (for example, the upper side and the lower side) of the display panel 110 according to a driving method, a panel design method, and the like.

The gate driving circuit 130 may be positioned only at one side (for example, a left side or a right side) of the display panel 110. In some cases, the gate driving circuit 130 may be positioned at both sides (for example, the left side and the right side) of the display panel 110 according to a driving method, a panel design method, and the like.

The plurality of gate lines GL disposed in the display panel 110 may include a plurality of scan lines SCL, a plurality of sense lines SENL, and a plurality of emission control lines EML. The scan line SCL, the sense line SENL, and the emission control line EML are lines for transmitting different types of signals (scan signal, sense signal, and emission control signal) to gate nodes of different types of transistors (scan transistor, sense transistor, and emission control transistor). Hereinafter, descriptions will be given with reference to FIG. 2.

The light emitting display device 100 according to the present aspects may be a self-luminous display such as an organic light emitting element (OLED) display, a quantum dot display, or a micro light emitting element (LED) display.

When the light emitting display device 100 according to the present aspects is the OLED display, each subpixel SP may include an OLED, which emits light by itself, as a light emitting element. When the light emitting display device 100 according to the present aspects is the quantum dot display, each subpixel SP may include a light emitting element made of quantum dots which are semiconductor crystals which emit light by themselves. When the light emitting display device 100 according to the present aspects is the LED display, each subpixel SP may include a micro LED, which emits light by itself and is made based on an inorganic material, as a light emitting element.

The organic light emitting display device 100 according to an embodiment of the present disclosure may include an active area AA and a non-active area NA surrounding the active area AA.

Figure 2:
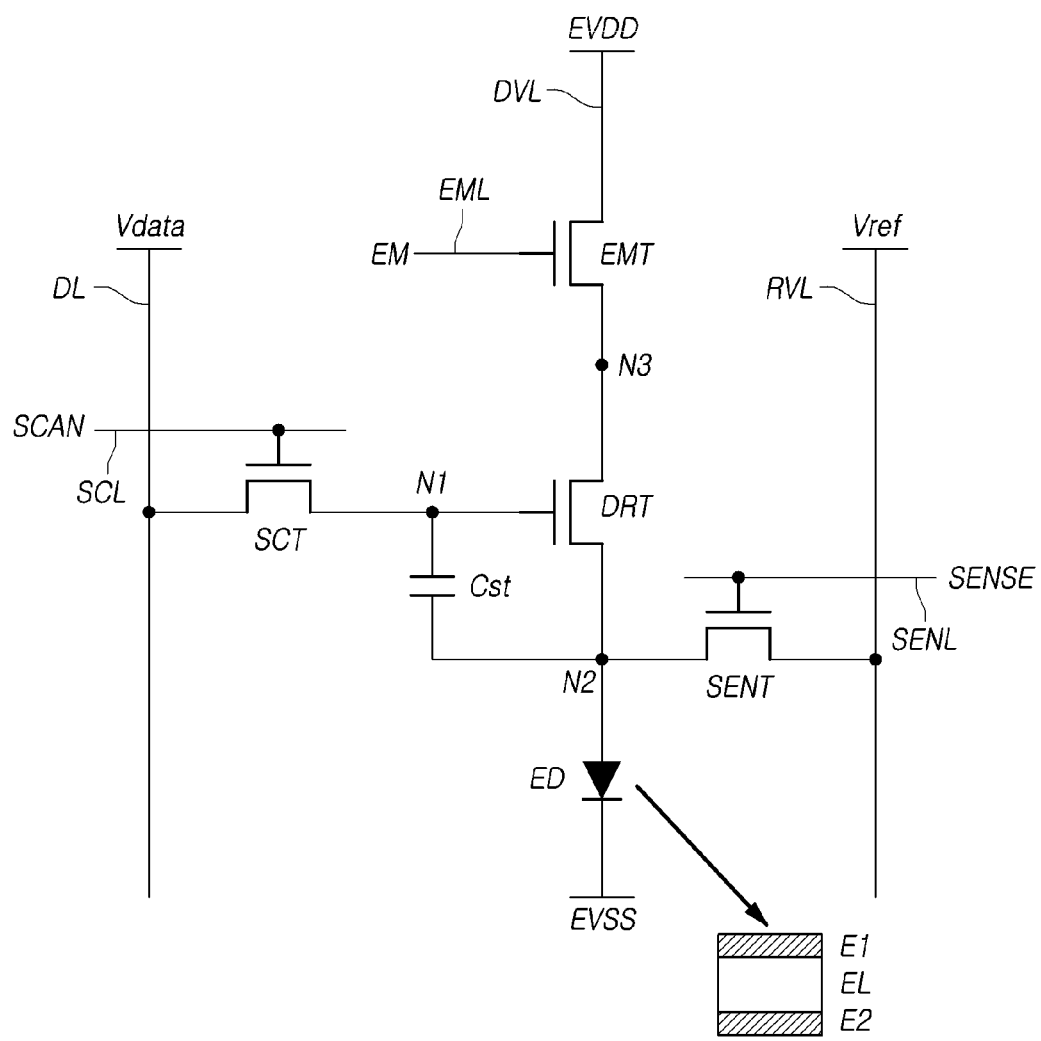
FIG. 2 is an equivalent circuit of a subpixel of the light emitting display device according to the present disclosure.

FIG. 2 is an equivalent circuit of the subpixel SP of the light emitting display device 100 according to aspects of the present disclosure.

Referring to FIG. 2, in the light emitting display device 100 according to the aspects of the present disclosure, each subpixel SP may include a light emitting element ED, a driving transistor DRT for controlling a current flowing in the light emitting element ED, a scan transistor SCT for transmitting a data voltage Vdata to the driving transistor DRT, a sense transistor SENT for an initialization operation, an emission control transistor EMT for emission control, a storage capacitor Cst for maintaining a voltage for a certain period, and the like.

The light emitting element ED includes a first electrode E1, a second electrode E2, and a light emitting layer EL positioned between the first electrode E1 and the second electrode E2. In the light emitting element ED, the first electrode E1 may be an anode or a cathode, and the second electrode E2 may be a cathode or an anode. The light emitting element ED may be, for example, an organic light emitting diode (OLED), a light emitting diode (LED), a quantum dot light emitting element, or the like.

The second electrode E2 of the light emitting element ED may be a common electrode. In this case, a base voltage EVSS may be applied to the second electrode E2 of the light emitting element ED. Here, the base voltage EVSS may be, for example, a ground voltage or a voltage similar to the ground voltage.

The driving transistor DRT is a transistor for driving the light emitting element ED and includes a first node N1, a second node N2, and a third node N3.

The first node N1 of the driving transistor DRT may be a node corresponding to a gate node and may be electrically connected to a source node or a drain node of the scan transistor SCT. The second node N2 of the driving transistor DRT may be electrically connected to the first electrode E1 of the light emitting element ED and may be a source node or a drain node. The third node N3 of the driving transistor DRT may be a node to which a driving voltage EVDD is applied, may be electrically connected to a driving voltage line DVL for supplying the driving voltage EVDD, and may be a drain node or a source node. Hereinafter, for convenience of description, an example in which the second node N2 of the driving transistor DRT is a source node and the third node N3 thereof is a drain node will be described.

The scan transistor SCT may control a connection between the first node N1 of the driving transistor DRT and a corresponding data line DL of the plurality of data lines DL in response to a scan signal SCAN supplied from a corresponding scan line SCL of the plurality of scan lines SCL, which is a type of the gate line GL.

The drain node or the source node of the scan transistor SCT may be electrically connected to the corresponding data line DL. The source node or the drain node of the scan transistor SCT may be electrically connected to the first node N1 of the driving transistor DRT. A gate node of the scan transistor SCT may be electrically connected to the scan line SCL, which is a type of the gate line GL, to receive the scan signal SCAN.

The scan transistor SCT may be turned on by the scan signal SCAN having a turn-on level voltage to transmit the data voltage Vdata supplied from the corresponding data line DL to the first node N1 of the driving transistor DRT.

The scan transistor SCT is turned on by the scan signal SCAN having a turn-on level voltage and turned off by the scan signal SCAN having a turn-off level voltage. Here, when the scan transistor SCT is an n-type, the turn-on level voltage may be a high level voltage, and the turn-off level voltage may be a low level voltage. When the scan transistor SCT is a p-type, the turn-on level voltage may be a low level voltage, and the turn-off level voltage may be a high level voltage.

The sense transistor SENT may control a connection between the second node N2 of the driving transistor DRT electrically connected to the first electrode E1 of the light emitting element ED and a corresponding reference line RVL of a plurality of reference lines RVL in response to a sense signal SENSE supplied from a corresponding sense line SENL of the plurality of sense lines SENL, which is a type of the gate line GL.

A drain node or a source node of the sense transistor SENT may be electrically connected to the reference line RVL. The source node or the drain node of the sense transistor SENT may be electrically connected to the second node N2 of the driving transistor DRT and electrically connected to the first electrode E1 of the light emitting element ED. A gate node of the sense transistor SENT may be electrically connected to the sense line SENL, which is a type of the gate line GL, to receive the sense signal SENSE.

The sense transistor SENT may be turned on to apply the reference voltage Vref supplied from the reference line RVL to the second node N2 of the driving transistor DRT.

The sense transistor SENT is turned on by the sense signal SENSE having a turn-on level voltage and turned off by the sense signal SENSE having a turn-off level voltage. Here, when the sense transistor SENT is an n-type, the turn-on level voltage may be a high level voltage, and the turn-off level voltage may be a low level voltage. When the sense transistor SENT is a p-type, the turn-on level voltage may be a low level voltage, and the turn-off level voltage may be a high level voltage.

The emission control transistor EMT may control a connection between the third node N3 of the driving transistor DRT and a corresponding driving voltage line DVL of a plurality of driving voltage lines DVL in response to an emission control signal EM supplied from a corresponding emission control line EML of the plurality of emission control lines EML, which is a type of the gate line GL. That is, as shown in FIG. 2, the emission control transistor EMT may be electrically connected between the third node N3 of the driving transistor DRT and the driving voltage line DVL.

A drain node or a source node of the emission control transistor EMT may be electrically connected to the driving voltage line DVL. The source node or the drain node of the emission control transistor EMT may be electrically connected to the third node N3 of the driving transistor DRT. A gate node of the emission control transistor EMT may be electrically connected to the emission control line EML, which is a type of the gate line GL, to receive the emission control signal EM.

Alternatively, the emission control transistor EMT may also control a connection between the second node N2 of the driving transistor DRT and the first electrode E1 of the light emitting element ED. That is, unlike what is shown in FIG. 2, the emission control transistor EMT may be electrically connected between the second node N2 of the driving transistor DRT and the light emitting element ED.

The emission control transistor EMT is turned on by the emission control signal EM having a turn-on level voltage and turned off by the emission control signal EM having a turn-off level voltage. Here, when the emission control transistor EMT is an n-type, the turn-on level voltage may be a high level voltage, and the turn-off level voltage may be a low level voltage. When the emission control transistor EMT is a p-type, the turn-on level voltage may be a low level voltage, and the turn-off level voltage may be a high level voltage.

The storage capacitor Cst may be electrically connected between the first node N1 and the second node N2 of the driving transistor DRT to maintain the data voltage Vdata corresponding to an image signal voltage or a voltage corresponding thereto for one frame time.

The storage capacitor Cst may be an external capacitor intentionally designed outside the driving transistor DRT rather than a parasitic capacitor (e.g., Cgs or Cgd) that is an internal capacitor between the first node N1 and the second node N2 of the driving transistor DRT.

Each of the driving transistor DRT, the scan transistor SCT, the sense transistor SENT, and the emission control transistor EMT may be an n-type transistor or a p-type transistor. All of the driving transistor DRT, the scan transistor SCT, the sense transistor SENT, and the emission control transistor EMT may be an n-type transistor or a p-type transistor. At least one of the driving transistor DRT, the scan transistor SCT, the sense transistor SENT, and the emission control transistor EMT may be an n-type transistor (or a p-type transistor), and the remainder thereof may be a p-type transistor (or an n-type transistor).

A structure of each subpixel shown in FIG. 2 is merely an example for description, and each subpixel may further include one or more transistors or may further include one or more capacitors in some cases. Alternatively, the plurality of subpixels may have the same structure, and some of the plurality of subpixels may have different structures.

Figure 3:
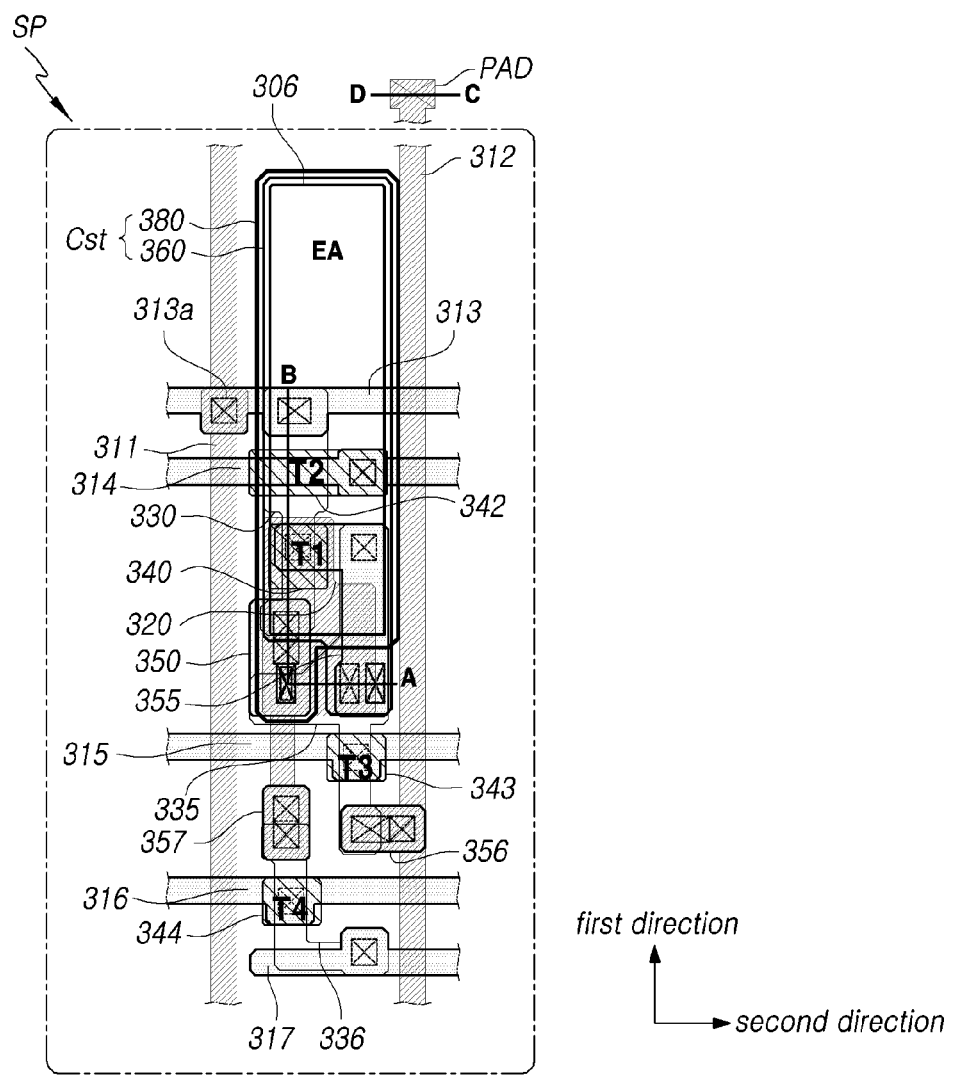
FIG. 3 is a plan view of a subpixel of the light emitting display device according to the present disclosure.

FIG. 3 is a plan view of a subpixel of the light emitting display device according to the present disclosure.

Referring to FIG. 3, the organic light emitting display device of the present disclosure may include at least one sub-pixel SP in the active area and a pad PAD in the non-active area.

One subpixel SP may include a plurality of thin film transistors T1, T2, T3, and T4, at least one storage capacitor Cst, and an organic light emitting diode. In addition, the sub-pixel SP may include a light emitting area EA in which light from the organic light emitting diode is emitted and a non-emitting area in which the light is not emitted. The non-emitting area may be disposed to surround the light emitting area EA.

When an area in which the plurality of thin film transistors and a plurality of signal lines are disposed is referred to as a circuit area of the subpixel SP, a portion of the light emitting area EA may be overlapped with a portion of the circuit area, but the present disclosure is not limited thereto. In some cases, the light emitting area EA and the circuit area may be not overlapped with each other.

For convenience of description, the following description will be mainly described with respect to a structure in which a portion of the light emitting area EA and a portion of the circuit area is overlapped with each other within the subpixel SP. Here, the circuit area that is not overlapped with the light emitting area EA may be included in the non-emitting area.

Each of the plurality of thin film transistors T1, T2, T3, and T4 may be any one of the transistors illustrated in FIG. 2. For example, the first thin film transistor T1 may be the driving transistor DRT of FIG. 2, the second thin film transistor T2 may be the emission control transistor EMT, and the third thin film transistor T3 may be the scan transistor SCT, and the fourth thin film transistor T4 may be the sense transistor SENT. However, this is only an example, and each of the plurality of thin film transistors T1, T2, T3, and T4 may be selected from among the transistors shown in FIG.2.

As shown in FIG. 3, a plurality of signal lines may be disposed in one subpixel SP. For example, there may be disposed the first signal line 311 and the second signal line 312 extending in the first direction and spaced apart from each other. In addition, there may be disposed a third signal line 313, a fourth signal line 314, a fifth signal line 315, and a sixth signal line 316 and a seventh signal line 317 extending in a second direction transverse to the first direction and spaced apart from each other.

As an example, the first signal line 311 may be the driving line DVL and the second signal line 312 may be the data line DL of FIG. 2. However, the present disclosure is not limited thereto, and the first signal line 311 may be a data line DL or a signal line to which the base voltage EVSS described in FIG. 2 is applied.

The third signal line 313 may be a signal line (e.g., the first signal line) which is contacted to the driving line DVL through the contact hole 313a, thereby being electrically connected to the driving line DVL. The fourth signal line 314 may be the emission control line EML, the fifth signal line 315 may be the scan line SCL, and the sixth signal line 316 may be a sense line SCL of FIG. 2. Also, although not shown in the drawings, the seventh signal line 317 may be a connection signal line electrically connected to the reference line RVL extending in the first direction.

The first and second signal lines 311 and 312 may be disposed on the same layer from each other, and the third to seventh signal lines 313, 314, 315, 316, and 317 may be disposed on the same layer from each. The third to seventh signal lines 313, 314, 315, 316, and 317 may be disposed on the layer different from the layer on which the first and second signal lines 311 and 312 are disposed.

The first thin film transistor T1 and the second thin film transistor T2 may be electrically connected by sharing the first active layer 330.

Specifically, the first thin film transistor T1 may include a first active layer 330, a first gate electrode 340, and a first electrode pattern 350.

A portion of the first active layer 330 may be overlapped with the light blocking layer 320. The light blocking layer 320 may be disposed beneath the first active layer 330.

The light blocking layer 320 may be disposed on the same layer as the first and second signal lines 311 and 312. In addition, in the subpixel SP, the light blocking layer 320 is spaced apart from the first signal line 311 and the second signal line 312, and the first signal line 311 and the second signal line 312 are spaced apart from each other and is disposed in the area between them.

In addition, a portion of the first active layer 330 may be overlapped with the first gate electrode 340.

An area of the first active layer 330 overlapped with the first gate electrode 340 may be a channel area of the first thin film transistor T1.

Also, the first active layer 330 may include a conductive area or an area which became conductive, and a portion of the conductive area may be contacted to the first electrode pattern 350 through a contact hole CH2. The first electrode pattern 350 may be disposed on the same layer as the third signal line 313 and may be spaced apart from the third signal line 313.

The first electrode pattern 350 may be electrically connected to the first electrode 380 of the organic light emitting diode through the contact hole CH6.

A portion of the top surface of the first electrode 380 may be overlapped with the bank 306, and the area where the top surface of the first electrode 380 not overlapped with the bank 306 is located corresponds to the emitting area EA of the sub-pixel SP.

The second thin film transistor T2 may include a first active layer 330 and a second gate electrode 342. The first active layer 330 included in the second thin film transistor T2 may have the same configuration as the first active layer 330 of the first thin film transistor T1.

The second gate electrode 342 of the second thin film transistor T2 overlapped with a portion of the first active layer 330 may be disposed on the first active layer 330. The second gate electrode 342 may be spaced apart from the first gate electrode 340 of the first thin film transistor T1.

The second gate electrode 342 may be electrically connected to the fourth signal line 314 disposed on the second gate electrode 342 through a contact hole (not shown).

The area of the first active layer 330 overlapped with the second gate electrode 342 may be a channel area of the second thin film transistor T2. That is, the first active layer 330 may include a channel area of the first thin film transistor T1 and the channel area of the second thin film transistor T2.

An area of the first active layer 330 other than the channel area of the first thin film transistor T1 and the channel area of the second thin film transistor T2 may be a conductive area or an area which became conductive. A portion of the conductive area of the first active layer 330 may be electrically connected to the third signal line 313.

The third thin film transistor T3 may include a second active layer 335, a third gate electrode 343, a second electrode pattern 355, and a third electrode pattern 356. The second electrode pattern 355 and the third electrode pattern 356 may be selected as one of a source electrode and a drain electrode of the third thin film transistor T3.

A portion of the second active layer 335 of the third thin film transistor T3 may be overlapped with a portion of the light blocking layer 320. The light blocking layer 320 may be disposed beneath the second active layer 335.

The third gate electrode 343 may be disposed on the second active layer 335.

A portion of the third gate electrode 343 may be contacted to a portion of the fifth signal line 315 in the contact hole (not shown). Accordingly, the third gate electrode 343 and the fifth signal line 315 may be electrically connected.

The area of the second active layer 335 overlapped with the third gate electrode 343 may be a channel area of the third thin film transistor T3.

In addition, the second active layer 335 may include a conductive area or an area which became conductive. For example, the second active layer 335 may be an area in which an area other than the channel area is conductive. A portion of the conductive area of the second active layer 335 may be electrically connected to each of the second electrode pattern 355 and the third electrode pattern 356 spaced apart from each other.

The second electrode pattern 355 and the third electrode pattern 356 may be disposed on the same layer as the fifth signal line 315.

The second electrode pattern 355 may be electrically connected to the first gate electrode 340 of the first thin film transistor T1.

The third electrode pattern 356 may be electrically connected to the second signal line 312.

One conductive pattern 360 may be disposed on the second electrode pattern 355. The conductive pattern 360 may be electrically connected to the second electrode pattern 355. In addition, the second electrode pattern 355 may be electrically connected to the light blocking layer 320 disposed beneath the second electrode pattern 355, but the present disclosure is not limited thereto.

The conductive pattern 360 may be disposed in a layer between the first electrode 380 and the second electrode pattern 355 of the organic light emitting diode.

A portion of the conductive pattern 360 may be overlapped with a portion of the first electrode 380. Each of the conductive pattern 360 and the first electrode 380 may be used or serve as an electrode of the storage capacitor Cst.

In addition, the conductive pattern 360 may be overlapped with all of the emitting area EA.

The area of the conductive pattern 360 may be smaller than the area of the first electrode 380 and larger than the area of the light emitting area EA.

In the organic light emitting display device according to the embodiment of the present disclosure, each of the conductive pattern 360 and the first electrode 380 may serve as an electrode of the storage capacitor Cst to secure the storage capacitor Cst with a wider area than the area of the light emitting area EA, so that the a high level of capacity of the storage capacitor Cst may be achieved even in a limited area of the sub-pixel.

As shown in FIG. 3, the conductive pattern 360 is overlapped with all of the first gate electrode 340 of the first thin film transistor T1, and the first electrode pattern 350 may be overlapped with a portion or all of the first gate electrode 340. Also, the conductive pattern 360 may be overlapped with all of the first active layer 330 of the first and second thin film transistors T1 and T2.

The conductive pattern 360 may be partially or entirely overlapped with the second gate electrode 342 of the second thin film transistor T2. In addition, the conductive pattern 360 may be also overlapped with a portion of each of the third signal line 313 and the fourth signal line 314.

A portion of the conductive pattern 360 may be overlapped with a portion of the second active layer 335 of the third thin film transistor T3 and a portion of the second electrode pattern 355. In addition, a portion of the conductive pattern 360 may be overlapped with a portion of the light blocking layer 320.

The conductive pattern 360 may be overlapped with a portion of the bank 306 defining the light emitting area EA and the non-emitting area NEA surrounding the light emitting area EA.

In a general organic light emitting display device, a storage capacitor Cst may be formed by using the light blocking layer 320, an active material layer disposed on the light blocking layer 320, and a gate electrode material layer disposed on the active material layer.

In the general organic light emitting display device, the capacity of the storage capacitor Cst may be increased through a method of increasing the size of the light blocking layer 320, which is an electrode of the capacitor Cst.

Meanwhile, the light blocking layer 320 may be formed in the same process as the first and second signal lines 311 and 312. When the size of the light blocking layer 320 increases, both the distance between the light blocking layer 320 and the first signal line 311 and the distance between the light blocking layer 320 and the second signal line 312 become very short, so it may be difficult to form the light blocking layer 320 and the first and second signal lines 311 and 312.

In addition, when the storage capacitor Cst is formed using the light blocking layer 320, the active material layer, and the gate electrode material layer, the storage capacitor Cst may be disposed only in the circuit area. In this case, as the size of each component corresponding to the electrode of the storage capacitor Cst is increased in order to increase the capacity of the storage capacitor Cst, so the size of the circuit area increases. Therefore, it is difficult to implement a high-resolution organic light emitting display device. In addition, there is a problem in that the size of the light emitting area EA is reduced.

However, in the embodiment of the present disclosure, each of the conductive pattern 360 and the first electrode 380 of the organic light emitting diode may be used as an electrode of the storage capacitor Cst.

The conductive pattern 360 and the first electrode 380 are disposed in all of the light emitting area EA and a portion of the non-emitting area NEA surrounding the light emitting area EA, so that the high capacity storage capacitor Cst may be implemented.

In addition, since the storage capacitor Cst does not need to be implemented by extending the area of the light blocking layer 320, the process of forming the light blocking layer 320, the first signal line 311, and the second signal line 312 may be facilitated.

The fourth thin film transistor T4 may include a third active layer 336, a fourth gate electrode 344, and a fourth electrode pattern 357. The fourth electrode pattern 357 may be a source electrode or a drain electrode of the fourth thin film transistor T4.

The fourth gate electrode 344 may be disposed on the third active layer 336. A portion of the fourth gate electrode 344 may be contacted to a portion of the sixth signal line 316 in a contact hole(not shown). Accordingly, the fourth gate electrode 344 may be electrically connected to the sixth signal line 316.

The area of the third active layer 335 overlapped with the fourth gate electrode 344 may be a channel area of the fourth thin film transistor T4. In addition, the third active layer 336 may include a conductive area or an area which became conductive. For example, the third active layer 336 may be an area in which an area other than the channel area is conductive.

A portion of the conductive area of the third active layer 336 may be contacted to a portion of the fourth electrode pattern 357 in the contact hole (not shown). Accordingly, the third active layer 336 and the fourth electrode pattern 357 may be electrically connected. In addition, other portion of the conductive area of the third active layer 336 may be contacted to a portion of the seventh signal line 317 in the contact hole. Accordingly, the third active layer 336 may be electrically connected to the seventh signal line 317.

The fourth electrode pattern 357 and the seventh signal line 317 may be disposed on the same layer and may be spaced apart from each other.

A pad PAD may be disposed in a portion of the non-active area surrounding the active area in which the subpixels SP are disposed. The pad PAD may include at least one pad electrode.

Figure 4:
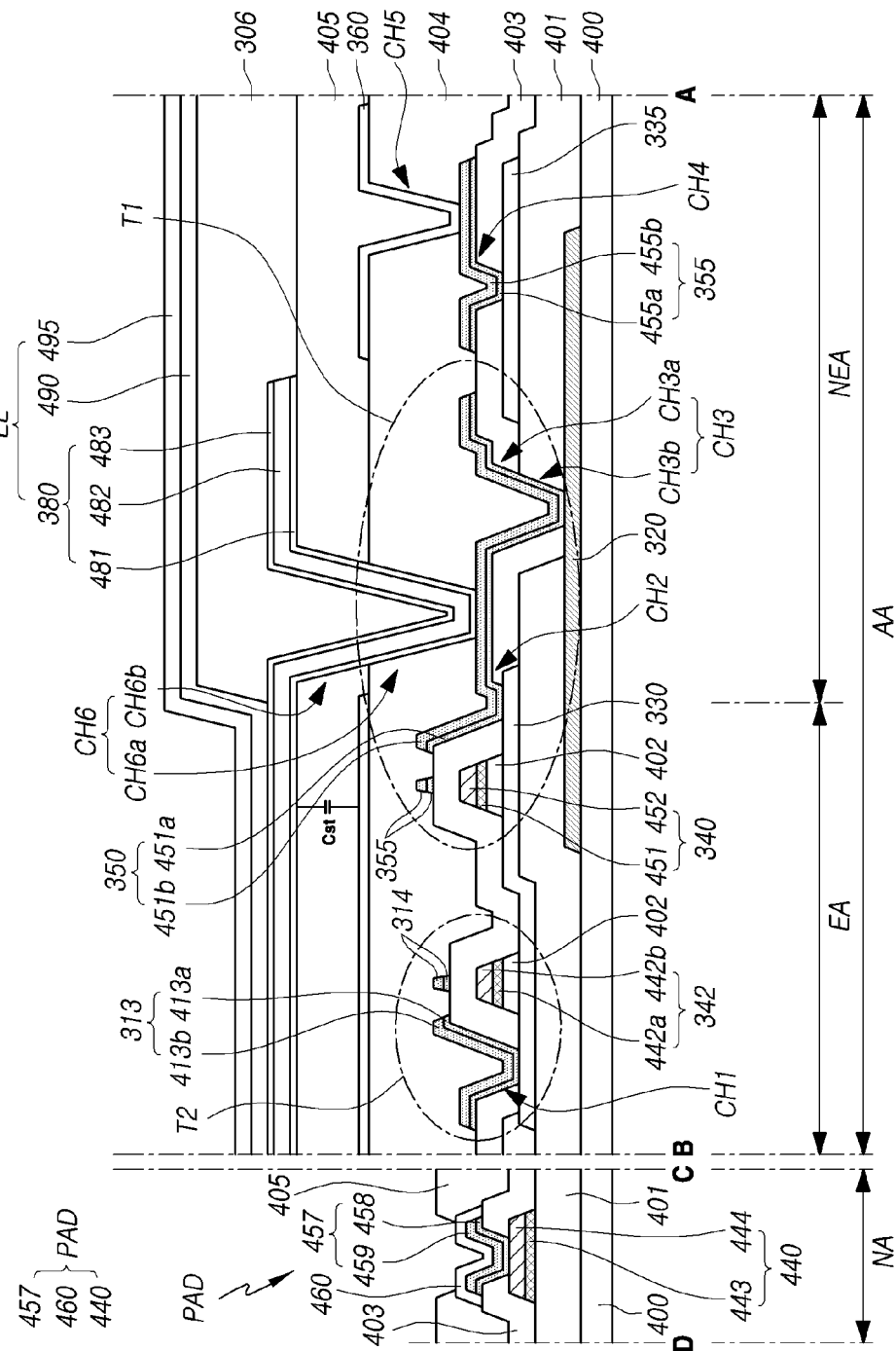
FIG. 4 is a cross-sectional view taken along lines A-B and C-D of FIG. 3.

With reference to FIG. 4, the structure of a portion of the subpixel SP and the pad PAD of FIG.3 will be specifically reviewed as follows.

FIG. 4 is a cross-sectional view taken along lines A-B and C-D of FIG. 3.

Referring to FIG. 4, when the organic light emitting display device 100 according to an embodiment of the present disclosure includes an active area AA and a non-active area NA surrounding the active area AA, the light blocking layer 320 may be disposed in the active area AA on the substrate 400.

The light blocking layer 320 may absorb or reflect light, such as aluminum (Al), gold (Au), silver (Ag), copper (Cu), tungsten (W), molybdenum (Mo), chromium (Cr)), a metal such as tantalum (Ta), titanium (Ti), or an alloy thereof, or a transparent conductive material, but the present disclosure is not limited thereto.

In addition, although FIG. 4 illustrates a structure in which the light blocking layer 320 is a single layer, the present disclosure is not limited thereto. The light blocking layer 320 may be a multilayer structure.

A buffer layer 401 may be disposed on the light blocking layer 320. One of the buffer layers 401 may include an inorganic insulating material such as silicon oxide (SiOx), silicon nitride (SiNx), or silicon oxynitride (SiON), but the present disclosure is not limited thereto. In FIG. 4, the buffer layer 401 has a single-layer structure, but the present disclosure is not limited thereto. The buffer layer 401 may have a multi-layer structure.

A first active layer 330 and a second active layer 335 may be included on the buffer layer 401. Although not shown in FIG. 4, the first and second active layers 330 and 335 may be disposed on the same layer as the third active layer 336.

One or more of the first and second active layers 330 and 335 may be formed of an oxide semiconductor. The oxide semiconductor may be a metal oxide semiconductor, and may be formed of i) an oxide of a metal such as molybdenum (Mo), zinc (Zn), indium (In), gallium (Ga), tin (Sn), titanium (Ti), or the like, or ii) an combination of a metal such as molybdenum (Mo), zinc (Zn), indium (In), gallium (Ga), tin (Sn), titanium (Ti), or the like and an oxide of molybdenum (Mo), zinc (Zn), indium (In), gallium (Ga), tin (Sn), titanium (Ti), or the like.

For example, one or more of the first and second active layers 330 and 335 may include at least one of zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO); however, embodiments of the present disclosure are not limited thereto.

The first active layer 330 and the second active layer 335 may be disposed to be spaced apart from each other.

As described above, the first active layer 330 may be an active layer shared by the first thin film transistor T1 and the second thin film transistor T2.

Although not shown in FIG. 4, the second active layer 335 may be an active layer including a channel area of the third thin film transistor T3 of FIG. 3.

A gate insulating layer 403 may be disposed on a portion of the top surface of the first active layer 330.

A first gate electrode 340 and a second gate electrode 342 may be disposed on the gate insulating layer 403.

The first gate electrode 340 has a structure in which two gate material layers 451 and 452 are stacked, and the second gate electrode 342 also has a structure in which two gate material layers 442a and 442b are stacked, but the present disclosure is not limited thereto. For example, each of the first and second gate electrodes 340 and 342 may be formed of a single layer or a multilayer of three or more layers.

Each of the gate material layers 451, 452, 442a, and 442b of the first and second gate electrodes 340 and 342 may include one of various conductive materials. For example, the conductive material may include a metal of aluminum (Al), gold (Au), silver (Ag), copper (Cu), tungsten (W), molybdenum (Mo), chromium (Cr), tantalum (Ta), titanium (Ti), etc., an alloy thereof, or a transparent conductive material, but the present disclosure is not limited thereto.

As shown in FIG. 4, the gate insulating layer 403 may be disposed in an area overlapped with each of the first and second gate electrodes 340 and 342.

An area in which the first active layer 330 is overlapped with the first gate electrode 340 may be a channel area of the first thin film transistor T1. Also, an area in which the first active layer 330 is overlapped with the second gate electrode 342 may be a channel area of the second thin film transistor T2. In other words, the first active layer 330 may include the channel area of the first thin film transistor T1 and the channel area of the second thin film transistor T2. An area in which the first active layer 330 is not overlapped with the first and second gate electrodes 330 and 342 may be a conductive area or an area which became conductive.

Through this structure, a signal applied from the first signal line 311 of FIG. 3 may be transmitted to the first thin film transistor T1 via the second thin film transistor T2.

Although not shown in FIG. 4, the first and second gate electrodes 340 and 342 may be disposed on the same layer as the third and fourth gate electrodes 343 and 344 of FIG. 3.

An interlayer insulating layer 403 may be disposed on the substrate 400 on which the first and second gate electrodes 340 and 342 are disposed. The interlayer insulating film 403 may include an inorganic insulating material such as silicon oxide (SiOx), silicon nitride (SiNx), or silicon oxynitride (SiON), but the present disclosure is not limited thereto.

The third signal line 313, the first electrode pattern 350, and the second electrode pattern 355 may be disposed on the interlayer insulating layer 403. The third signal line 313, the first electrode pattern 350 and the second electrode pattern 355 may be disposed on the same layer and may include the same material.

The third signal line 313 has a structure in which two electrode material layers 413a and 413b are stacked, and the first electrode pattern 350 also has a structure in which two electrode material layers 451a, and 451b are stacked, and the second electrode pattern 355 may also have a structure in which two electrode material layers 455a and 455b are stacked, but the present disclosure is not limited thereto. For example, each of the third signal line 313, the first electrode pattern 350, and the second electrode pattern 355 may be formed of a single layer or a multilayer structure of three or more layers.

The electrode material layers 413a, 413b, 451a, 451b, 455a, 455b of the third signal line 313, the first electrode pattern 350, and the second electrode pattern 355 have one of various conductive materials. For example, For example, the conductive material may include a metal of aluminum (Al), gold (Au), silver (Ag), copper (Cu), tungsten (W), molybdenum (Mo), chromium (Cr), tantalum (Ta), titanium (Ti), etc., an alloy thereof, or a transparent conductive material, but the present disclosure is not limited thereto.

Each of the third signal line 313, the first electrode pattern 350, and the second electrode pattern 355 may be disposed to be spaced apart from each other.

The third signal line 313 may be contacted to a portion of the conductive area of the first active layer 330 through the first contact hole CH1 provided in the interlayer insulating layer 403.

The first electrode pattern 350 may be contacted to other portion of the conductive area of the first active layer 330 through the second contact hole CH2 provided in the interlayer insulating layer 403.

In addition, the first electrode pattern 350 may be contacted to a portion of the top surface of the light blocking layer 320 through the third contact hole CH3 provided in the interlayer insulating layer 403 and the buffer layer 401. The third contact hole CH3 may have a structure in which contact hole CH3a in the buffer layer 401 and a contact hole CH3b in the interlayer insulating layer 403 are overlapped with each other.

The second electrode pattern 350 may be contacted to a portion of the conductive area of the second active layer 335 through the fourth contact hole CH4 provided in the interlayer insulating layer 403.

The first insulating layer 404 may be disposed on the substrate 400 on which the third signal line 313, the first electrode pattern 350, and the second electrode pattern 355 are disposed. As an example, the first insulating layer 404 may include an organic material capable of flattening the surface of the substrate 400. The first insulating layer 404 may be referred to as a first planarization layer or a first overcoat layer.

The conductive pattern 360 may be disposed on the first insulating layer 404. As an example, the conductive pattern 360 may include titanium (Ti) or an alloy containing titanium (Ti), but the present disclosure is not limited thereto. The conductive pattern 360 may be contacted to a portion of the top surface of the second electrode pattern 355 through the fifth contact hole CH5 provided in the first insulating layer 404.

The second insulating layer 405 may be disposed on the substrate 400 on which the conductive pattern 360 is disposed. As an example, the second insulating layer 405 may include an organic material capable of flattening the surface of the substrate 400. The second insulating layer 405 may be referred to as a second planarization layer or a second overcoat layer.

The organic light emitting diode EL including the first electrode 380, an organic layer 490, and a second electrode 495 may be disposed on the second insulating layer 405. The first electrode 380 may be an anode electrode of the organic light emitting diode EL, and the second electrode 495 may be a cathode electrode of the organic light emitting diode EL.

The first electrode 380 of the organic light emitting diode EL may be disposed on the second insulating layer 405. The first electrode 380 may be contacted to a portion of the top surface the first electrode pattern 350 of the first thin film transistor T1 through the sixth contact hole CH6 in the first and second insulating layers 404 and 405. The sixth contact hole CH6 may have a structure in which, a contact hole CH6a in the first insulating layer 404, and contact hole CH6b provided in the second insulating layer 405 are overlapped with each other. As an example, the first electrode 380 of the organic light emitting diode EL may have a multilayer structure.

For example, as shown in FIG. 4, the first electrode 380 is disposed on the first layer 481 on the second insulating layer 405, a second layer 482 on the first layer 481 and a third layer 483 on the second layer 482.

The first layer 481 and the third layer 483 may include a transparent conductive material. For example, each of the first layer 481 and the third layer 483 may include at least one of indium-tin oxide (ITO), indium-zinc oxide (IZO), etc., but the present disclosure is not limited thereto.

The second layer 482 of the first electrode 380 may include a reflective metal. For example, the second layer 482 may include at least one of silver (Ag), aluminum (Al), neodium (Nd), nickel (Ni), titanium (Ti), tantalum (Ta), copper (Cu), and alloys thereof, but the present disclosure is not limited thereto.

A bank 306 may be disposed on the first electrode 380 and the second insulating layer 405. The bank 306 may be disposed to expose a portion of the top surface of the first electrode 380.

The area in which the first electrode 380 and the bank 306 are not overlapped may be the emitting area EA of the organic light emitting display device. Also, the area in which the bank 306 is disposed may be a non-emitting area NEA of the organic light emitting display device.

The organic layer 490 of the organic light emitting diode EL including a light emitting layer may be disposed on the bank 306 and the first electrode 308.

FIG. 4 illustrates a structure in which the organic layer 490 is disposed not only in the light emitting area EA but also in the non-emitting area NEA, but the present disclosure is not limited thereto. For example, the organic layer 490 may be disposed only on the top surface of the first electrode 308 which is not overlapped with the bank 306.

The second electrode 495 of the organic light emitting diode EL may be disposed on the organic layer 380. The second electrode 495 may include a transparent conductive material. For example, the second electrode 495 may include at least one of indium-tin oxide (ITO) and indium-zinc oxide (IZO), but the present disclosure is no limited thereto.

In addition, the second electrode 495 may include a conductive material. For example, each of the first layer 481 and the third layer 483 may include at least one of magnesium (Mg), silver (Ag), and ytterbium (Yb), but the present disclosure is not limited thereto.

Through this structure, light emitted from the organic layer 490 of the organic light emitting diode EL may be emitted to the outside of the second electrode 495 of the organic light emitting diode EL.

The first electrode 380 of the organic light emitting diode EL and the conductive pattern 360 overlapped with the first electrode 380 may serve as the storage capacitor Cst.

The conductive pattern 30 and the first electrode 380 may be overlapped with all of the emitting area EA. In addition, as described with reference to FIG. 3, the conductive pattern 30 and the first electrode 380 have a structure overlapped with even in a portion of the non-emitting area NEA, so that each sub-pixel may include has a high-capacity storage capacitor Cst.

The organic light emitting display device according to an embodiment of the present disclosure may include at least one pad PAD disposed in a non-active area. The pad PAD may include at least one pad electrode.

For example, as shown in FIG. 4, the pad PAD may include a first pad electrode 440, a second pad electrode 457 disposed on the first pad electrode 440, and a third pad electrode 460 disposed on the second pad electrode 457.

Specifically, a buffer layer 401 may be disposed beneath the first pad electrode 440. The first pad electrode 440 may be disposed on the same layer as the first and second gate electrodes 340 and 342 disposed in the active area AA.

The first pad electrode 440 may have a structure in which two layers of first pad electrode material layers 443 and 444 are stacked. The first pad electrode material layers 443 and 444 may include the same material as the gate material layers 451, 452, 442a and 442b of the first and second gate electrodes 340 and 342.

An interlayer insulating layer 403 may be disposed on the first pad electrode 40.

The second pad electrode 457 may be disposed on the interlayer insulating layer 403. The second pad electrode 357 may be contacted to a portion of the top surface of the first pad electrode 440 through a contact hole provided in the interlayer insulating layer 403.

The second pad electrode 457 is disposed on the same layer as the third signal line 313, the first electrode pattern 350, and the second electrode pattern 355 disposed in the active area AA.

In addition, the second pad electrode 457 may have a structure in which two layers of the second pad electrode material layers 458 and 459 are stacked. The second pad electrode material layers 458 and 459 include the same material as the electrode material layers 413a, 413b, 451a, 451b, and 455a, and 455b of the third signal line 313, the first electrode pattern 350, and the second electrode pattern 355.

A third pad electrode 460 may be disposed on the second pad electrode 457. The third pad electrode 460 may be disposed to surround the top and side surfaces of the second pad electrode 457. The third pad electrode 460 may include the same material as the conductive pattern 360 disposed in the active area AA. For example, the third pad electrode 460 may include titanium (Ti) or an alloy containing titanium (Ti).

A second insulating layer 405 may be disposed on the substrate 400 on which the third pad electrode 460 is disposed. The second insulating layer 405 may be disposed to expose a portion of the top surface of the third pad electrode 460.

In the process of forming the organic light emitting display device according to an embodiment, the second insulating layer 405 is formed on the third pad electrode 460 and the conductive pattern 360, and a material for the first electrode 380 of the organic light emitting diode EL may be formed on the second insulating layer 405.

In order to form the first electrode 380, the material of the first electrode 380 may be patterned, and the material of the first electrode 380 is patterned through etch process such as a wet etch process using an etchant. In this case, the third pad electrode 460 that is not overlapped with the second insulating layer 405 may be damaged by the etchant.

In the organic light emitting display device according to an embodiment, since the third pad electrode 460 includes titanium (Ti) or an alloy containing titanium (Ti), it has the effect of maintaining electrical characteristics and an intact structure without being damaged due to a solution used to pattern the material of the first electrode 380.

Hereafter, the steps of forming the sub-pixels of the organic light emitting display device according to an embodiment of the present disclosure will be specifically described with reference to the drawings.

FIGS. 5A, 5B to 15A, 15B illustrate the steps of forming the subpixel of the light emitting display device according to aspects of the present disclosure.

Figure 5A:
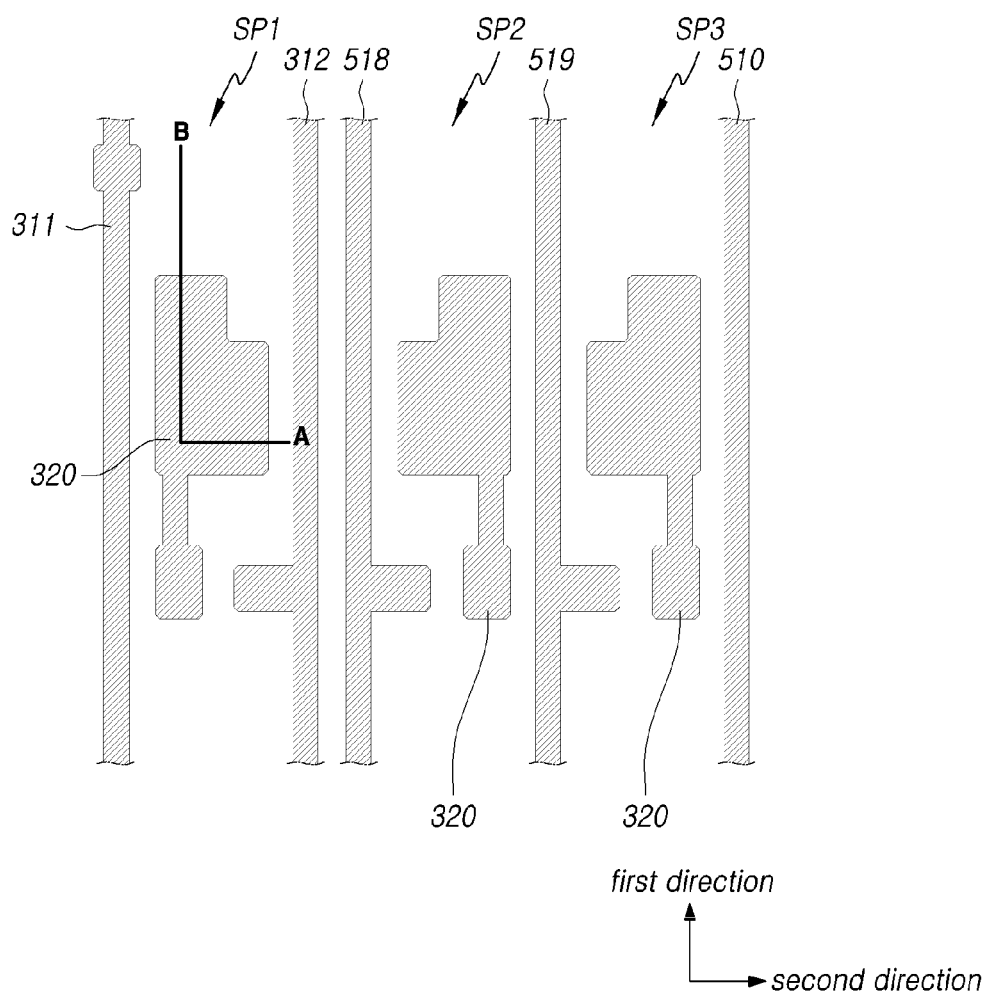
Figure 5B:
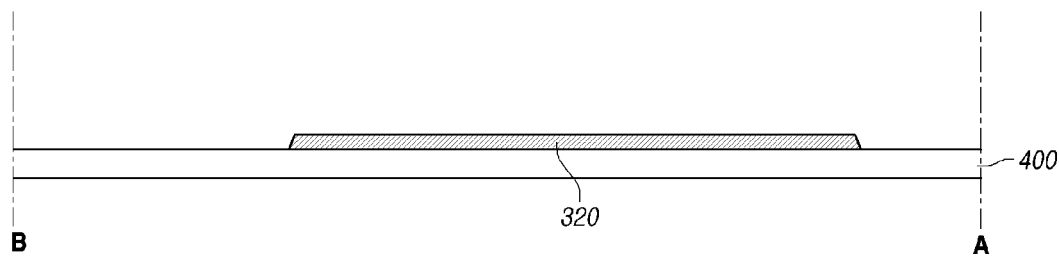

Referring to FIGS. 5A and 5B, the organic light emitting display device according to embodiments of the present disclosure may include a plurality of sub-pixels SP1, SP2, and SP3. For example, the organic light emitting display device may include a first sub-pixel SP1, a second sub-pixel SP2, and a third sub-pixel SP3.

A first signal line 311, a second signal line 312, an eighth signal line 518, and a ninth signal line 519, a tenth signal line 510 extending in the first direction and spaced apart from each other on the substrate, and a light blocking layer 320 may be formed on a substrate 400.

The first signal line 311 may be the driving line DVL of FIG. 2, and the second signal line 312, the eighth signal line 518, and the ninth signal line 519 may each be a data line DL of FIG. 2. Also, the tenth signal line 510 may be a signal line to which the base voltage EVSS is applied.

A light blocking layer 520 may be formed in each of the area between the first signal line 311 and the second signal line 312, the area between the eighth signal line 518 and the ninth signal line 519, and the area between the ninth signal line 519 and the tenth signal line 510.

Figure 6A:
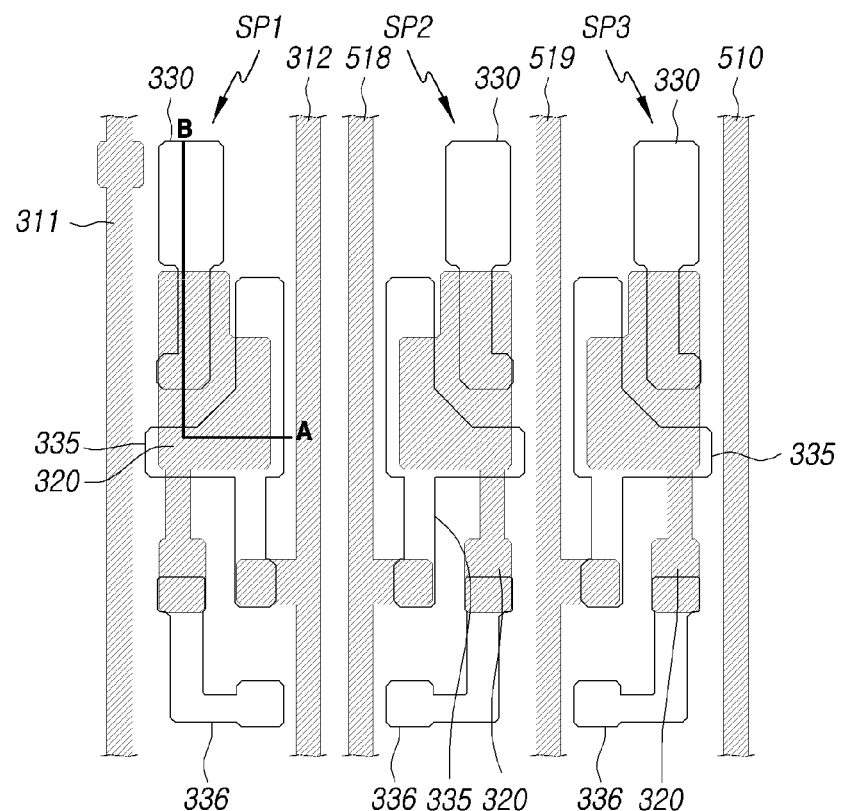
Figure 6B:
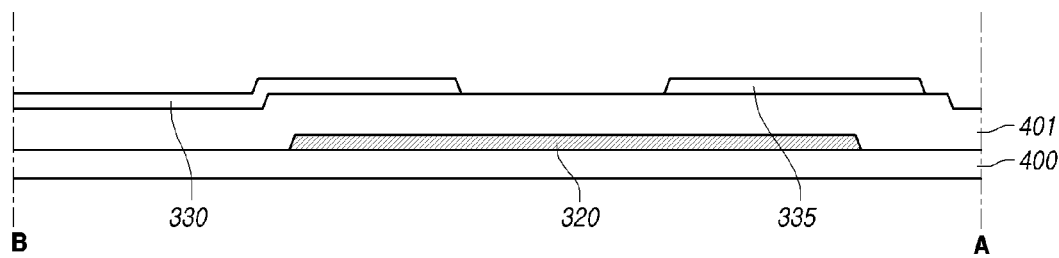

Subsequently, as shown in FIGS. 6A and 6B, the buffer layer 401 may be formed on the substrate 400 on which the first signal line 311, the second signal line 312, the eighth signal line 518, the ninth signal line 519, and the tenth signal line the signal line 510 and the light blocking layer 320 are formed.

A first active layer 330, a second active layer 335, and a third active layer 336 are formed on the buffer layer 401 in each of the first to third sub-pixels SP1, SP2, and SP3 so that they may be spaced apart from each other.

Figure 7A:
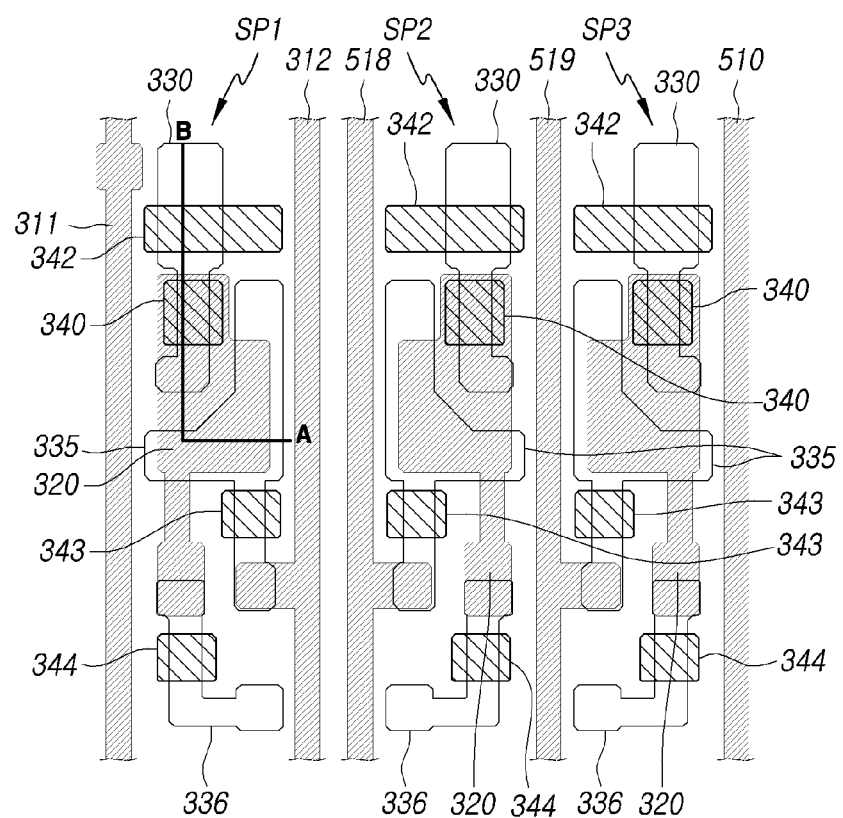
Figure 7B:
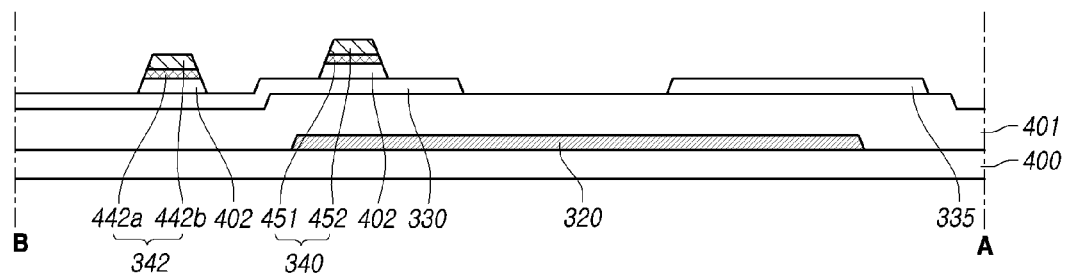

Thereafter, as shown in FIGS. 7A and 7B, a gate insulating layer 402 may be formed on the substrate 400 on which the first to third active layers 330, 335, and 336 are formed. In this case, the gate insulating layer 402 may be formed on a portion of the top surface of the first to third active layers 330, 33, and 336.

The first gate electrode 340, the second gate electrode 342, the third gate electrode 343, and the fourth gate electrode 344 may be formed on the gate insulating layer 402 in each of the subpixels SP1, SP2, and SP3.

Each of the first gate electrode 340, the second gate electrode 342, the third gate electrode 343, and the fourth gate electrode 344 may be formed to be spaced apart from each other.

The first gate electrode 340 and the second gate electrode 342 is overlapped with a portion of the first active layer 330, the third gate electrode 343 is overlapped with a portion of the second active layer 335, and the fourth gate electrode 344 may be overlapped with a portion of the third active layer 336.

The first active layer 330 has a channel area provided in an area overlapped with the first and second gate electrodes 340 and 342, and the second active layer 335 includes a channel area provided in an area overlapped with the third gate electrode 343, and the third active layer 336 may have a channel area provided in an area overlapped with the fourth gate electrode 344. Also, an area in which the first to third active layers 330, 335, and 336 do not overlap the gate electrodes may be a conductive area or an area which became conductive.

Figure 8A:
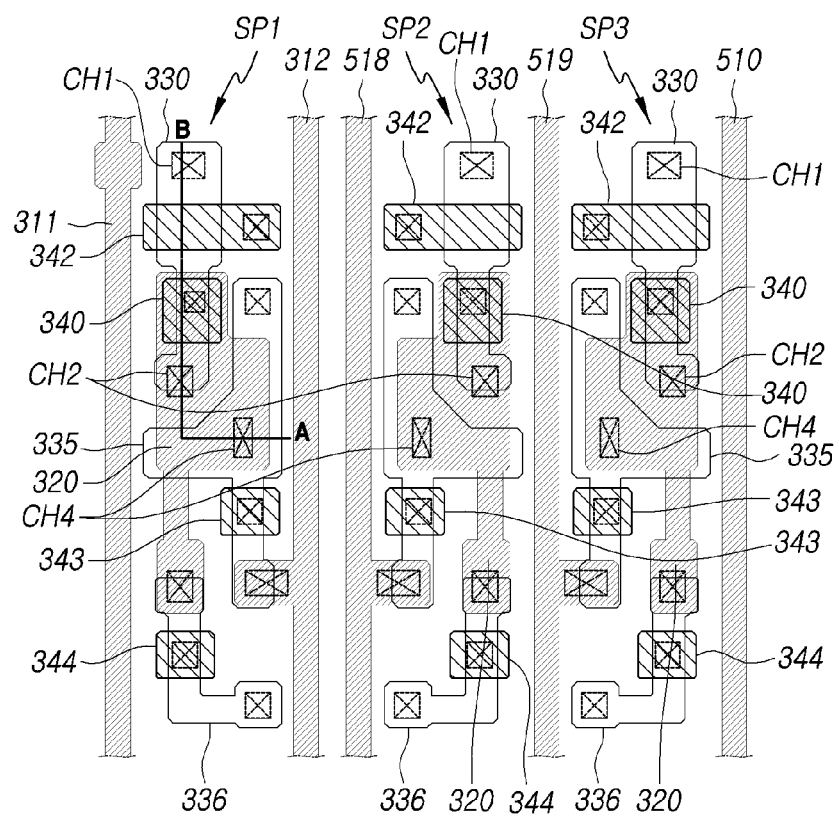
Figure 8B:
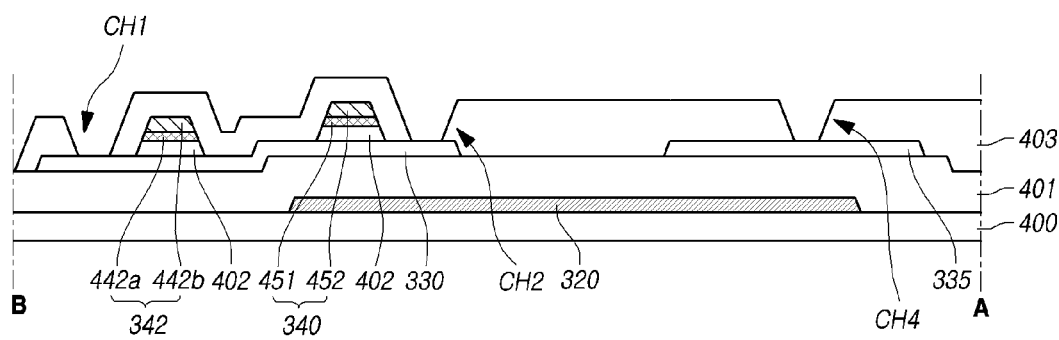

Thereafter, as shown in FIGS. 8A and 8B, an interlayer insulating layer 403 may be formed on the substrate 400 on which the first to fourth gate electrodes 640, 342, 343, and 344 are formed.

Specifically, an interlayer insulating film 403 may be formed on the substrate 400 on which the first to fourth gate electrodes 340, 342, 343, and 344 are formed, and then, a plurality of contact holes may be formed in the interlayer insulating layer 403 through the patterning process using the mask.

The interlayer insulating layer 403 may include the first, second, and fourth contact holes CH1, CH2, and CH4 described with reference to FIG. 4. A plurality of contact holes of the interlayer insulating layer 403 including the first, second, and fourth contact holes CH1, CH2 and CH4 may be formed in each subpixel SP1, SP2, and SP3.

The first contact hole CH1 may expose a portion of the top surface of the first active layer 330 among the conductive areas of the first active layer 330.

The second contact hole CH2 may expose a portion of the top surface of the first active layer 330 among the conductive areas of the first active layer 330, and be spaced apart from the contact hole CH1.

The fourth contact hole CH4 may expose a portion of the top surface of the second active layer 335 among the conductive areas of the second active layer 335.

In addition, as shown in FIGS. 8A and 8B, the interlayer insulating layer 403 may include contact holes exposing a portion of the top surface of each of the first to fourth gate electrodes 340, 342, 343, and 344 for contacting each of the first to fourth gate electrodes 340, 342, 343, and 344 and the signal line 311.

In addition, the interlayer insulating layer 403 may further include two contact holes exposing a portion of the top surface of the second active layer 335 among the conductive areas of the second active layer 335 for contacting each of the second electrode pattern and the third electrode pattern of the third thin film transistor T3 with the second active layer 335. The contact holes of the interlayer insulating layer 403 provided on the second active layer 335 may be spaced apart from each other.

In addition, the interlayer insulating layer 403 may further include two contact holes exposing a portion of the top surface of the third active layer 336 among the conductive areas of the third active layer 336 for contacting each of the fourth electrode pattern and the seventh signal line of the fourth thin film transistor T4 with the third active layer. The contact holes of the interlayer insulating layer 403 provided on the third active layer 336 may be spaced apart from each other.

Figure 9A:
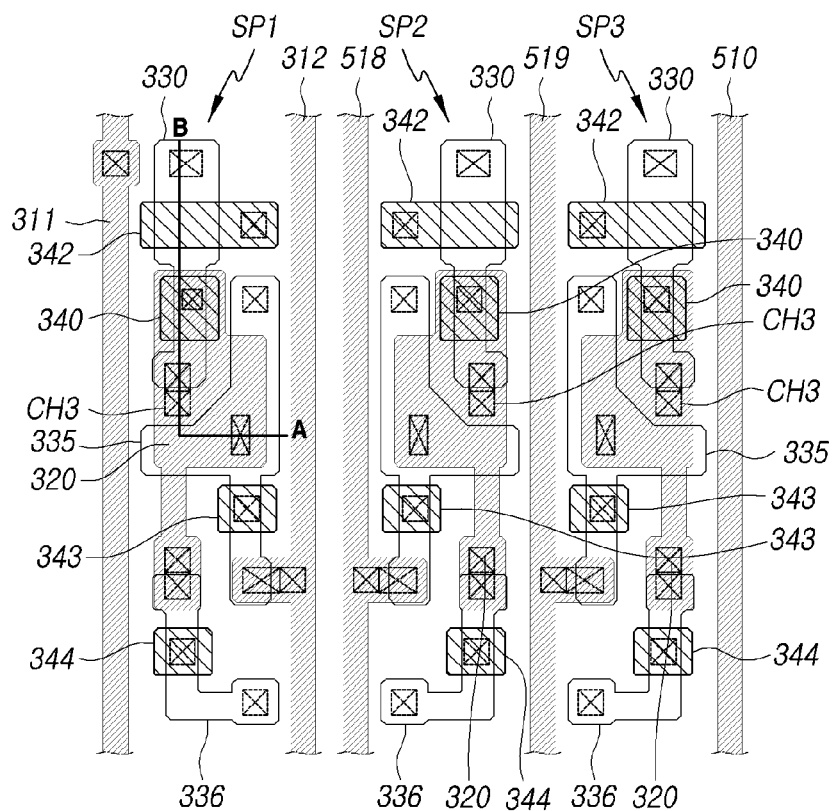
Figure 9B:
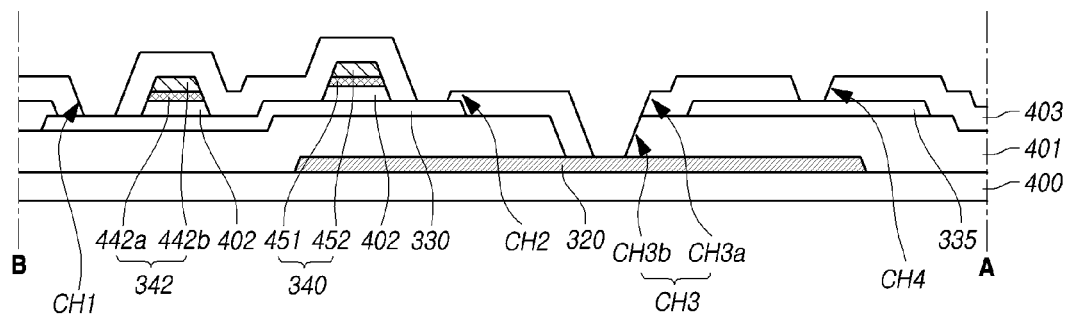

Thereafter, as shown in FIGS. 9A and 9B, a plurality of contact holes may be formed in the interlayer insulating layer 403 and the buffer layer 401 through a patterning process using a mask.

The interlayer insulating layer 403 and the buffer layer 401 may include the third contact hole CH3 described with reference to FIG. 4. A plurality of contact holes including the third contact hole CH3 formed in the interlayer insulating layer 403 and the buffer layer 401 may be formed in each subpixel SP1, SP2, and SP3.

The third contact hole CH3 may expose a portion of the top surface of the light blocking layer 320.

In addition, the interlayer insulating layer 403 and the buffer layer 401 may further include a contact hole spaced apart from the third contact hole CH3, while exposing a portion of the top surface of the light blocking layer 320.

In addition, the interlayer insulating layer 403 and the buffer layer 401 may include a contact hole exposing a portion of the top surface of each of the first signal line 311 and the second signal line 312.

Figure 10A:
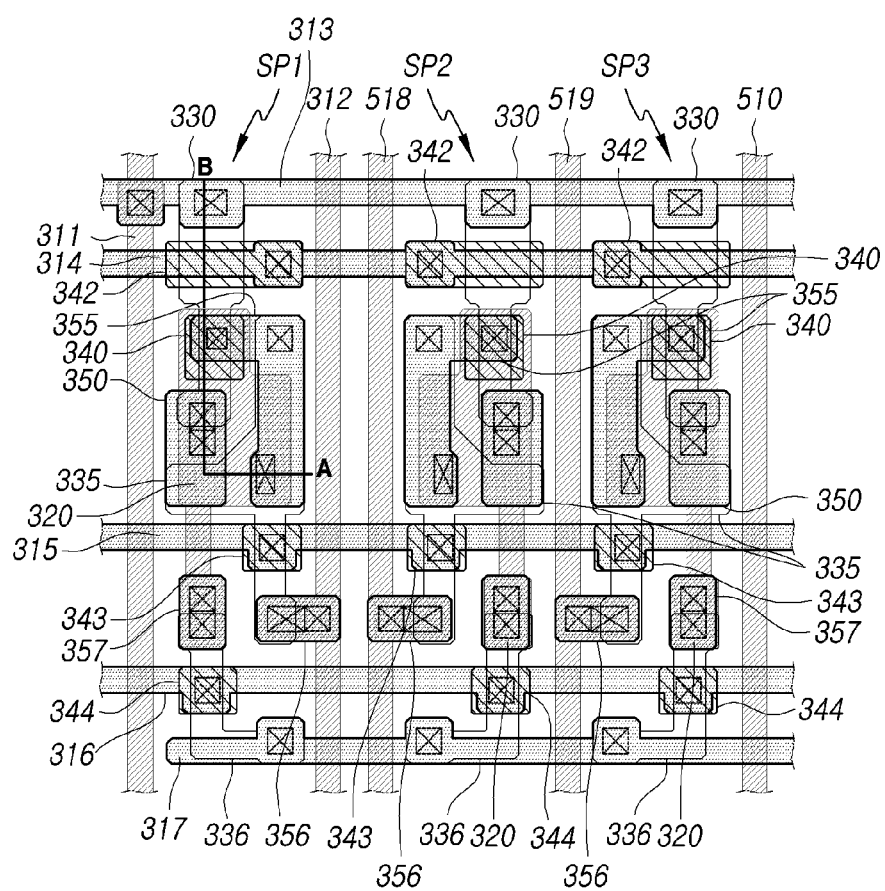
Figure 10B:
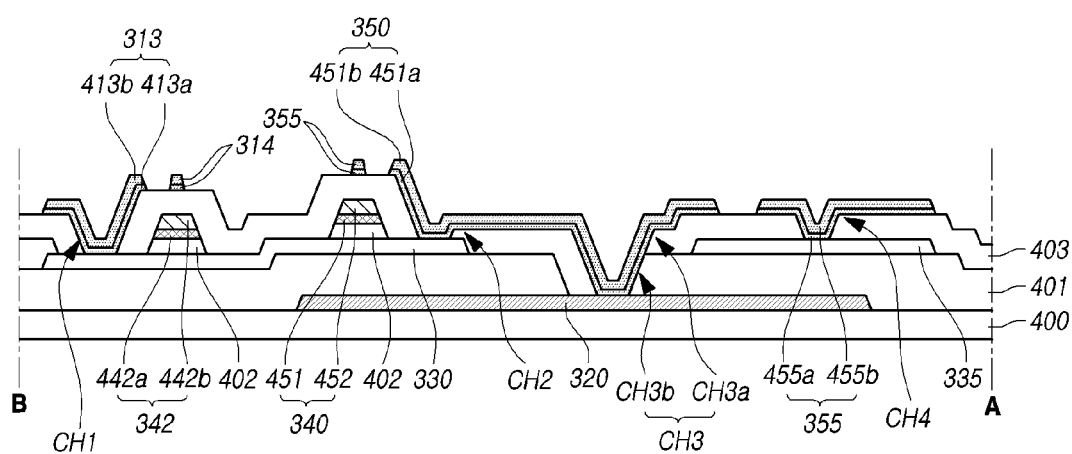

Thereafter, as shown in FIGS. 10A and 10B, a plurality of signal lines and a plurality of electrode patterns may be formed on the substrate 400 on which the interlayer insulating layer 403 is formed.

Specifically, after forming an electrode material layer on the substrate 400 on which the interlayer insulating film 403 is formed, the third to seventh signal lines 313, 314, 315, 316, and 317, and first to fourth electrode patterns 350, 355, 356, and 357 may be formed on the substrate 400 through a patterning process using a mask.

The third to seventh signal lines 313, 314, 315, 316, and 317 and the first to fourth electrode patterns 350, 355, 356 and 357 may be contacted to components overlapped with the contact holes through the contact holes shown in FIGS. 8 and 9, respectively.

Figure 11A:
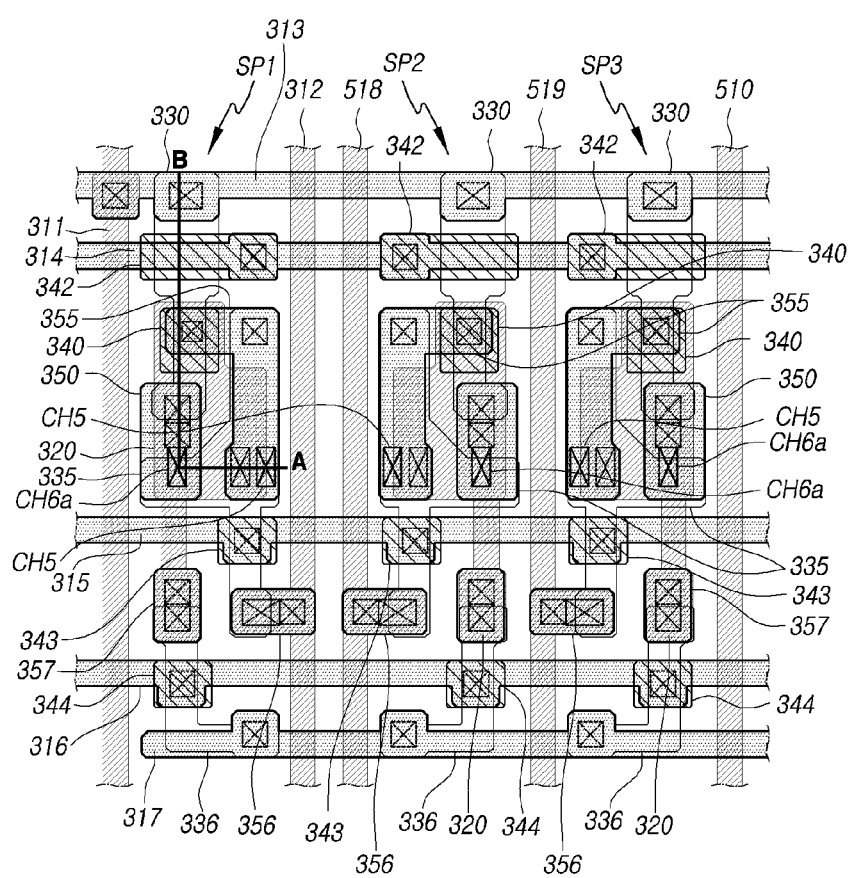
Figure 11B:
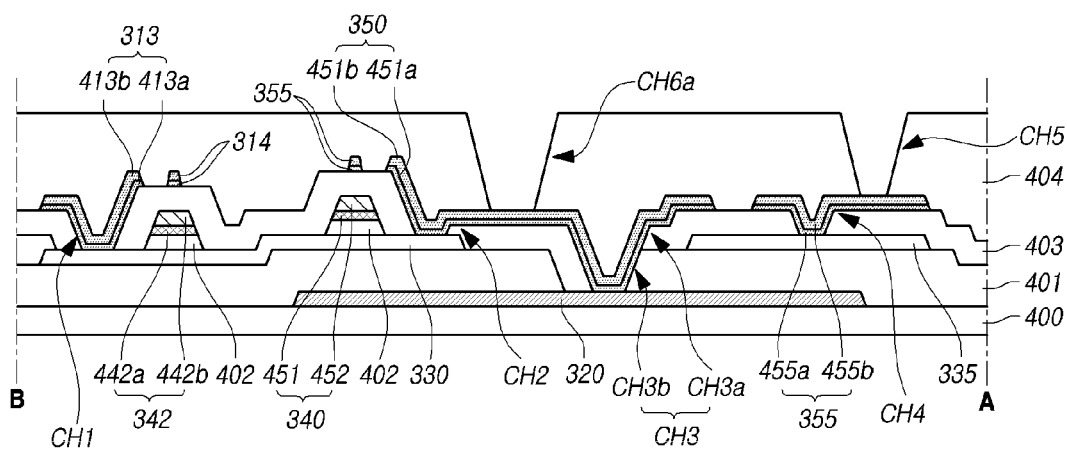

Subsequently, as shown in FIGS. 11A and 11B the first insulating layer 404 may be formed on the third to seventh signal lines 313, 314, 315, 316, and 317 and the first to fourth electrode patterns 350, 355, 356, and 357.

Specifically, the first insulating layer 404 are formed on the substrate 400 on which the third to seventh signal lines 313, 314, 315, 316, 317 and the first to fourth electrode patterns 350, 355, 356, 357 and then a plurality of contact holes are formed in the first insulating layer 404 through a patterning process using a mask, to form the first insulating layer shown in FIGS. 11A and 11B.

The first insulating layer 404 may include the fifth contact hole CH5 and a portion CH6a of the sixth contact hole CH6 described with reference to FIG. 4. A plurality of contact holes of the first insulating layer 404 including the fifth contact hole CH5 and the portion CH6a of the sixth contact hole CH6 may be formed in each subpixel SP1, SP2, and SP3.

The fifth contact hole CH5 may expose a portion of the top surface of the second electrode pattern 355 connected to the second active layer 335.

A portion CH6a of the sixth contact hole CH6 may expose a portion of a top surface of the first electrode pattern 350 connected to the first active layer 330.

Figure 12A:
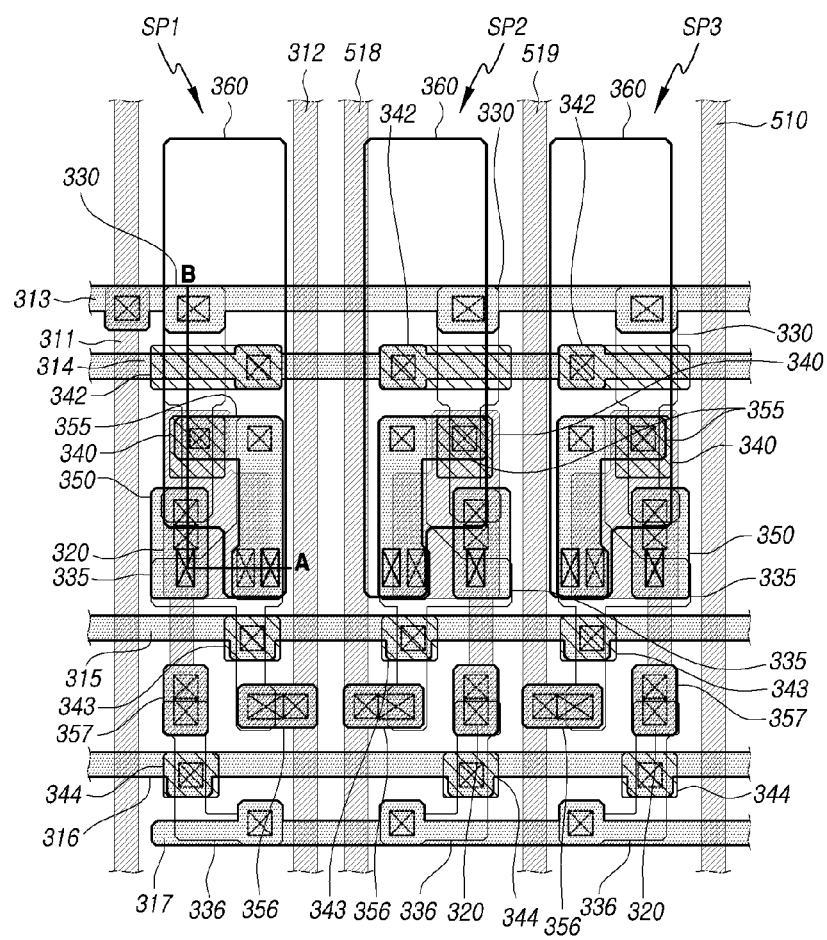
Figure 12B:
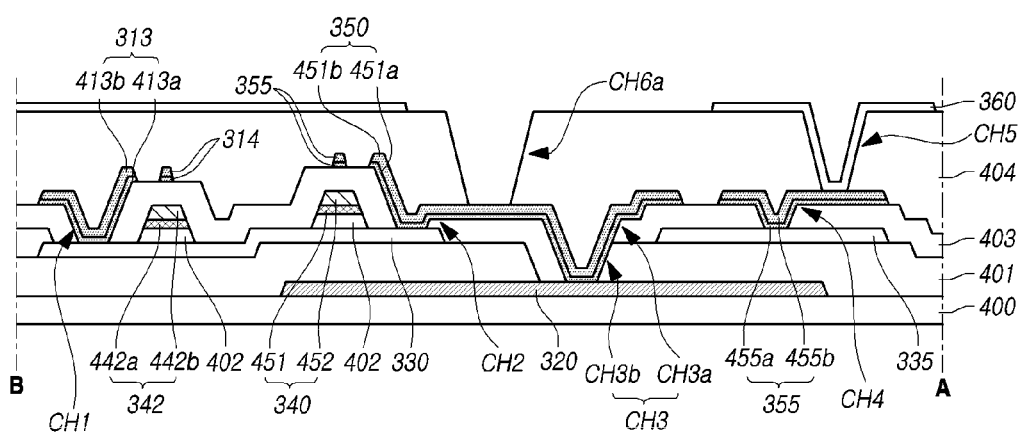

Thereafter, as shown in FIGS. 12A and 12B, a conductive pattern 360 may be formed on the first insulating layer 404.

Specifically, a conductive pattern material may be formed on the substrate 400 on which the first insulating layer 404 is formed, and then, the conductive pattern material is patterned through a patterning process using a mask to form the conductive pattern 360 shown in FIGS. 12A and 12B. The conductive pattern 360 may be formed in each sub-pixel SP1, SP2, and SP3.

The conductive pattern 360 may be contacted to a portion of the top surface of the second connection pattern 355 through the fifth contact hole CH5 of the first insulating layer 404.

The conductive pattern 360 may is not overlapped with a portion CH6a of the sixth contact hole of the first insulating layer 404.

In addition, the conductive pattern 360 may be overlapped with a portion of the first electrode pattern 350 and be overlapped with all of the second electrode pattern 355.

In addition, the conductive pattern 360 may be overlapped with all of the first gate electrode 340 and be overlapped with a portion of the second gate electrode 342.

Also, the conductive pattern 360 may be overlapped with all of entire first active layer 330 and partially overlap the second active layer 335.

In addition, the conductive pattern 360 may be overlapped with a portion of the third signal line 313 and may be overlapped with a portion of the fourth signal line 314.

Figure 13A:
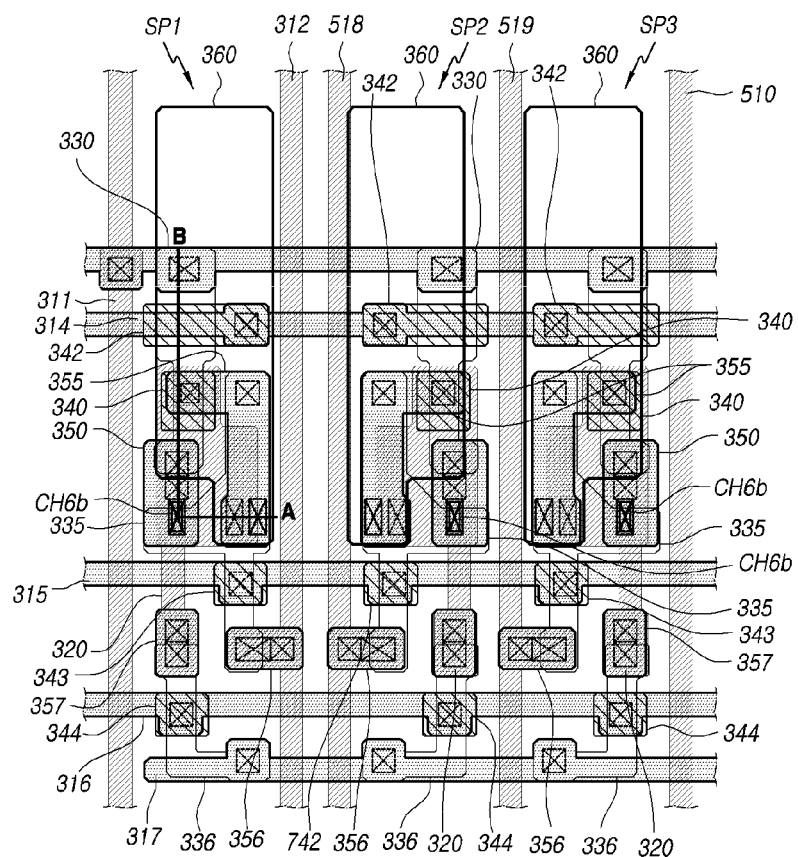
Figure 13B:
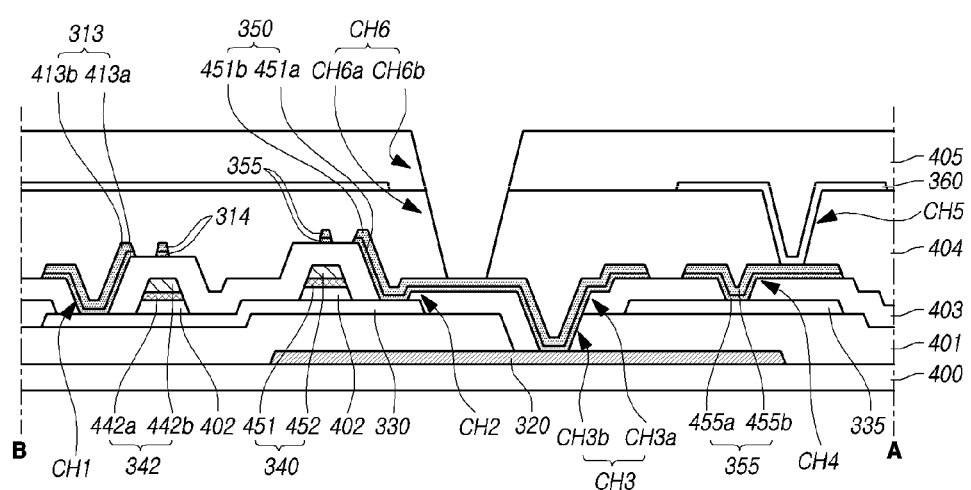

Thereafter, as shown in FIGS. 13A and 13B, a second insulating layer 405 may be formed on the conductive pattern 360.

Specifically, the second insulating film 405 may be formed on the substrate 400 on which the conductive pattern 360 is formed, and then a contact hole may be formed in the second insulating film 405 through a patterning process using a mask to form the second insulating layer 405 shown in FIGS. 13A and 13B.

The second insulating layer 405 may include other portion CH6*b* of the sixth contact hole CH6 described in FIG. 4. The contact hole CH6*b* of the second insulating layer 405 may be overlapped with the contact hole CH6*a* of the first insulating layer 404 of FIGS. 11A and 11B. Also, a contact hole CH6*b* of the second insulating layer 405 may be formed in each subpixel SP1, SP2, and SP3.

The contact hole CH6*b* of the second insulating film 405 may expose a portion of the top surface of the first electrode pattern 350 connected to the first active layer 330 together with the contact hole CH6*a* of the first insulating film 404.

Figure 14A:
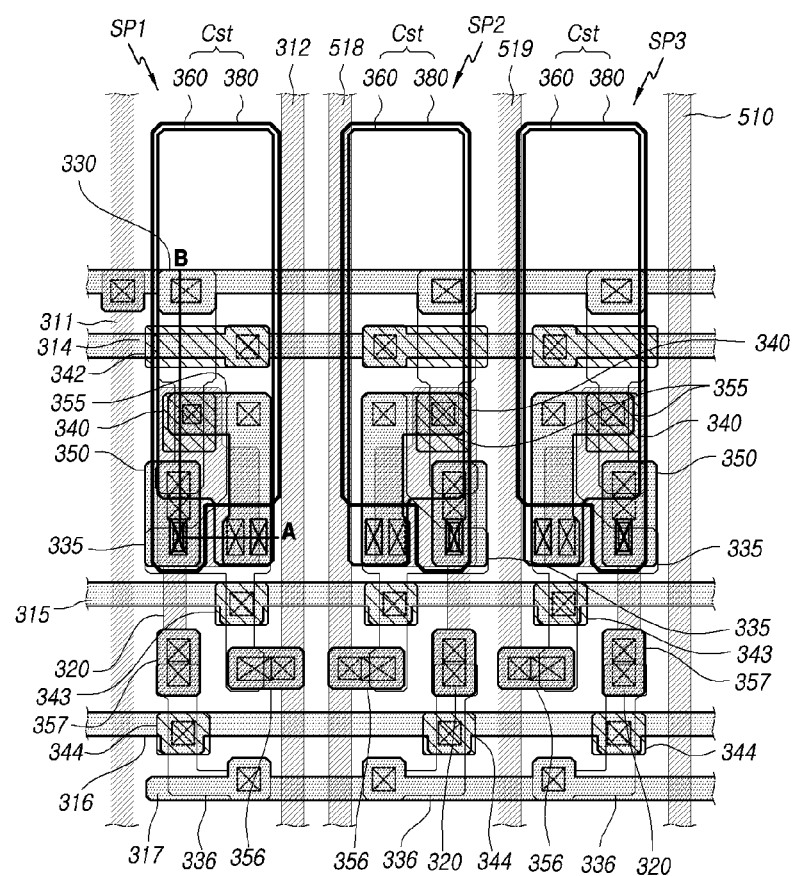
Figure 14B:
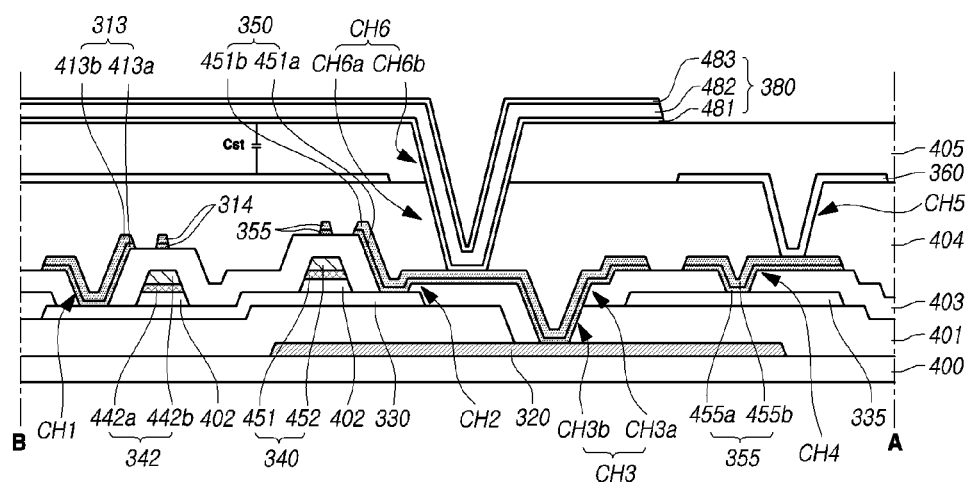

Thereafter, as shown in FIGS. 14A and 14B, a first electrode 380 of an organic light emitting diode EL may be formed on the second insulating layer 405.

Specifically, the first electrode 380 of the organic light emitting device EL may be formed on the substrate 400 on which the second insulating film 405 is formed, and then pattern the first electrode 380 through a patterning process using a mask form the first electrode 380 shown in FIGS. 14A and 14B. The first electrode 380 of the organic light emitting diode EL may be formed in each subpixel SP1, SP2, and SP3.

The first electrode 380 may be contacted to a portion of the top surface of the first electrode pattern 350 through the sixth contact hole CH6 formed in the first and second insulating layers 404 and 405.

Also, the first electrode 380 may is not overlapped with the fifth contact hole CH5 provided in the first insulating layer 404.

Also, the first electrode 380 may be overlapped with all of the first electrode pattern 350 and be overlapped with a portion of the second electrode pattern 355.

In addition, the first electrode 380 may be overlapped with all of the first gate electrode 340 and be overlapped with a portion or all of the second gate electrode 342.

Also, the first electrode 380 may be overlapped with all of the first active layer 330 and partially overlap the second active layer 335.

Also, the first electrode 380 may be overlapped with a portion of the third signal line 313 and be overlapped with a portion of the fourth signal line 314.

In addition, a portion of the first electrode 380 may be overlapped with a portion of the conductive pattern 360.

Each of the first electrode 380 and the conductive pattern 360 may serve as a storage capacitor Cst electrode.

Figure 15A:
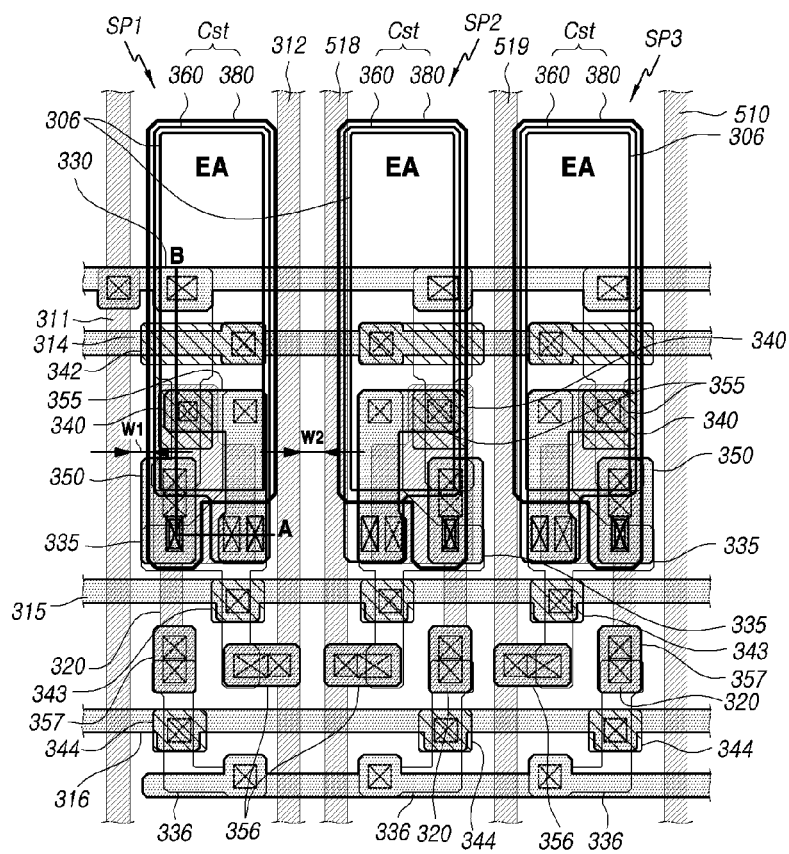
Figure 15B:
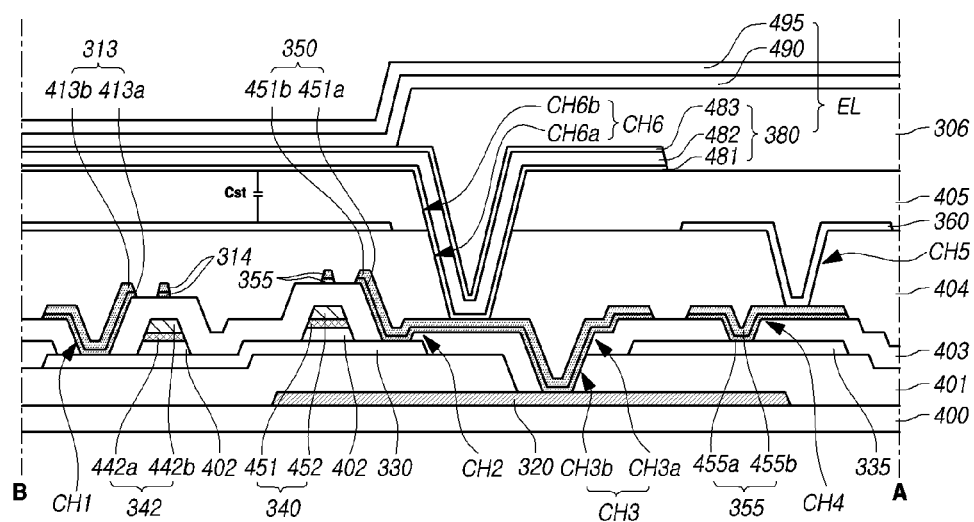

Thereafter, as shown in FIGS. 15A and 15B, a bank 306 may be formed on the substrate 400 on which the first electrode 380 is formed.

The bank 306 may be formed to expose a portion of the top surface of the first electrode 380. The area in which the top surface of the first electrode 380 exposed by the bank 306 is located may be the emitting area EA of each subpixel.

Lights emitted through the emitting areas EA of the first to third subpixels SP1, SP2, and SP3 may have different colors. For example, the first subpixel SP1 may be include a light emitting area EA that emits red R, the second subpixel SP2 may be include a light emitting area EA that emits green G, and the third The sub-pixel SP3 may be include a light emitting area EA that emits blue B. However, the present disclosure is not limited thereto. As an example, the first to fourth sub-pixels SP1, SP2, and SP3 may include light-emitting areas EA emitting the same color such as white W.

Referring to FIGS. 15A and 15B, the area of the electrodes such as the conductive pattern and the first electrode included in the storage capacitor Cst in each of the subpixels SP1, SP2, and SP3 may be larger than the area of the light emitting area EA.

The electrodes of the storage capacitor Cst may be overlapped with all of the light emitting area EA and may be formed in a portion of the non-emitting area surrounding the light emitting area EA. Accordingly, the storage capacitor Cst may have a large capacity even in a limited area of the sub-pixel.

As described above, in a general organic light emitting display device, the light blocking layer 320 and the active material layer formed on the light blocking layer 320, the gate electrode material layer formed on the active material layer, etc., was used to form a storage capacitor Cst.

In this case, the size of the light blocking layer 320 is designed to be large in order to increase the capacity of the storage capacitor Cst, so that the distance between the light blocking layer 320 and adjacent signal lines (e.g., the distance between the light blocking layer and the first signal line, the distance between the light blocking layer and the second signal line, the distance between the light blocking layer and the eighth signal line, distance between the light blocking layer and the ninth signal line, the interval between the light blocking layer and the tenth signal line, etc.) and the gap between the signal lines (for example, the gap between the second signal line and the eighth signal line, etc.) is reduced. Therefore it is difficult to pattern the signal lines and the light blocking layer 320, so that frequent defects of the organic light emitting display device may be occurred.

On the other hand, in the organic light emitting display device according to the embodiment of the present disclosure, the electrodes of the storage capacitor Cst are formed to overlap all of the entire light emitting area EA and a portion of the non-emitting area NEA, so that it may reduce the defect rate due to the formation of the high-capacity storage capacitor Cst since it is not necessary to narrow the gap between the signal lines adjacent to the light blocking layer 320 or the gap between the signal lines.

Meanwhile, in FIGS. 5 to 15, the steps of forming the first to third subpixels SP1, SP2, and SP3 in the organic light emitting display device has been mainly described. The first to third sub-pixels SP1, SP2, and SP3 may be one pixel area, but the present disclosure is not limited thereto. For example, the organic light emitting display device according to the embodiment of the present disclosure may have a structure in which one pixel includes two or four or more sub-pixels.

According to the embodiments of the present disclosure, since the electrodes of the storage capacitor are designed to be wider than the light emitting area, a storage capacitor with a high capacity can be formed without difficulty in designing a sub-pixel with a small area even in a high-resolution display device. It is possible to provide the organic light emitting display panel and an organic light emitting display device including the same.

In addition, according to the embodiments of the present disclosure, it is possible to implement a storage capacitor having a high capacity without reducing the distance between the plurality of signal lines or the distance between the signal lines and the light blocking layer, so the process is difficult. Accordingly, it is possible to provide an organic light emitting display panel capable of lowering a defective rate caused by this and an organic light emitting display device including the same.

The above description has been presented to enable any person skilled in the art to make and use the technical idea of the present disclosure, and has been provided in the context of a particular application and its requirements. Various modifications, additions, and substitutions to the described aspects will be readily apparent to those skilled in the art, and the general principles defined herein may be applied to other aspects and applications without departing from the spirit and scope of the present disclosure. The above description and the accompanying drawings provide an example of the technical idea of the present disclosure for illustrative purposes only. That is, the disclosed aspects are intended to illustrate the scope of the technical idea of the present disclosure. Thus, the scope of the present disclosure is not limited to aspects shown but is to be accorded the widest scope consistent with the claims. The scope of protection of the present disclosure should be construed based on the following claims, and all technical ideas within the scope of equivalents thereof should be construed as being included within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light emitting display device comprising:
   a substrate;
   a thin film transistor disposed on the substrate and including a first active layer, a first gate electrode, and a first electrode pattern;
   a first insulating layer disposed on the thin film transistor;
   a conductive pattern disposed on the first insulating layer;
   a second insulating layer disposed on the conductive pattern;
   a first electrode disposed on the second insulating layer, and coupled to the first electrode pattern; and
   a bank exposing a portion of a top surface of the first electrode,
   wherein the first electrode and the conductive pattern is configured as an electrode of a storage capacitor,
   wherein the conductive pattern is overlapped with the top surface of the first electrode mostly not overlapped with the bank, and
   wherein the first electrode and the conductive pattern is overlapped with all of the first active layer, all of the first gate electrode, and a portion of the first electrode pattern.

2. The organic light emitting display device according to claim 1, further comprising: an organic light emitting device including the first electrode, an organic layer disposed on the first electrode, a light emitting layer, and a second electrode disposed on the organic layer.

3. The organic light emitting display device according to claim 1, wherein the thin film transistor includes a driving transistor.

4. The organic light emitting display device according to claim 1, wherein an area of the first electrode is greater than an area of the conductive pattern.

5. The organic light emitting display device according to claim 1, further comprising:
   a non-emitting area adjacent to a light emitting area in which the top surface of the first electrode is exposed by the bank,
   wherein all of the light emitting area and a portion of the non-emitting area are overlapped with the conductive pattern and the first electrode.

6. The organic light emitting display device according to claim 1, further comprising:
   a second active layer disposed on the same layer as the first active layer and spaced apart from the first active layer; and
   a second electrode pattern disposed on the second active layer and contacted to a portion of a top surface of the second active layer.

7. The organic light emitting display device according to claim 6, wherein the conductive pattern is disposed on the second electrode pattern,
   a portion of a top surface of the second electrode pattern is coupled to the conductive pattern.

8. The organic light emitting display device according to claim 7, wherein a portion of the second electrode pattern is overlapped with a light emitting area.

9. The organic light emitting display device according to claim 6, wherein the first electrode and the conductive pattern is overlapped with a portion of the second active layer.

10. The organic light emitting display device according to claim 6, further comprising:
    a light blocking layer disposed beneath the first active layer and the second active layer and overlapped with a portion of the first active layer and a portion of the second active layer,
    wherein the first electrode and the conductive pattern is overlapped with a portion of the light blocking layer.

11. The organic light emitting display device according to claim 10, wherein all of the first active layer is overlapped with a light emitting area,
    a portion of the second active layer is overlapped with the light emitting area, and
    a portion of the light blocking layer is overlapped with the light emitting area.

12. The organic light emitting display device according to claim 1, further comprising:
    a first signal line and a second signal line disposed on the substrate, extending in a first direction and spaced apart from each other; and
    a third signal line extending in a second direction transverse to the first direction and contacted to a portion of a top surface of the first active layer, and a fourth signal line spaced apart from the third signal line.

13. The organic light emitting display device according to claim 12, further comprising:
    a second gate electrode contacted to a portion of the fourth signal line, overlapped with the first active layer, and spaced apart from the first gate electrode,
    wherein the first electrode and the conductive pattern is overlapped with part or all of the second gate electrode.

14. The organic light emitting display device according to claim 13, wherein a portion of the third signal line, a portion of the fourth signal line, and a portion of the second gate electrode are overlapped with an emitting area.

15. The organic light emitting display device according to claim 1, wherein the first insulating layer and the second insulating layer include a contact hole exposing a portion of a top surface of the first electrode pattern, and
wherein the conductive pattern is not overlapped with the contact hole.

16. The organic light emitting display device according to claim 1, further comprising:
a pad portion on which at least one pad electrode is disposed in a non-active area surrounding an active area including the thin film transistor and the storage capacitor.

17. The organic light emitting display device according to claim 16, wherein the pad portion includes a first pad electrode disposed on the substrate, a second pad electrode disposed on the first pad electrode and electrically coupled to the first pad electrode, and a third pad electrode surrounding a top surface and a side surface of the second pad electrode.

18. The organic light emitting display device according to claim 17, wherein the first pad electrode is disposed on the same layer as the gate electrode,
the second pad electrode is disposed on the same layer as the first and second electrodes,
the third pad electrode is disposed on the same layer as the conductive pattern,
the third pad electrode and the conductive pattern include titanium or an alloy containing titanium.

19. An organic light emitting display panel comprising:
a substrate;
a thin film transistor disposed on the substrate, the thin film transistor including a first active layer, a first gate electrode, and a first electrode pattern;
a storage capacitor including an electrode;
a first insulating layer disposed on the thin film transistor;
a conductive pattern disposed on the first insulating layer;
a second insulating layer disposed on the conductive pattern;
a first electrode disposed on the second insulating layer, and contacting the first electrode pattern; and
a bank exposing a portion of a top surface of the first electrode,
wherein the first electrode and the conductive pattern is configured as the electrode of the storage capacitor,
wherein the conductive pattern is overlapped with the top surface of the first electrode not overlapped with the bank, and
wherein the first electrode and the conductive pattern is overlapped with all of the first active layer, all of the first gate electrode, and a portion of the first electrode pattern.

* * * * *